(12) United States Patent
Wang

(10) Patent No.: US 6,362,113 B1
(45) Date of Patent: Mar. 26, 2002

(54) METHOD OF FORMING PATTERN

(75) Inventor: Ling-Sung Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/491,067

(22) Filed: Jan. 25, 2000

(30) Foreign Application Priority Data

Dec. 30, 1999 (TW) .......................... 88123298 A

(51) Int. Cl.$^7$ .............................. H01L 21/44
(52) U.S. Cl. ............... 438/738; 438/400; 438/427; 438/429; 438/689; 438/735; 438/736
(58) Field of Search ................. 438/400, 427, 438/429, 689, 736, 735, 738

(56) References Cited

U.S. PATENT DOCUMENTS 5,523,258 A * 6/1996 Petti et al. .................. 437/186

* cited by examiner

Primary Examiner—Charles Bowers
Assistant Examiner—Lisa Kilday
(74) Attorney, Agent, or Firm—J. C. Patents

(57) ABSTRACT

A method of forming a desired rectangular pattern in a material layer above a substrate. The method includes providing a substrate having a material layer thereon. A hard mask layer is next formed over the material layer, and then a first photoresist layer having a first pattern therein is formed over the hard mask layer. A first etching operation is carried out while using the first photoresist layer as an etching mask to remove a portion of the hard mask layer, thereby transferring the pattern in the first photoresist layer to the hard mask layer. The first photoresist layer is removed. A second photoresist layer having a second pattern therein is formed over the substrate. A second etching operation is carried out to remove a portion of the material layer while using the patterned second photoresist layer and the hard mask layer as an etching mask. Hence, the desired rectangular pattern is formed in the material layer.

17 Claims, 23 Drawing Sheets

METHOD OF FORMING PATTERN

CROSS-REFERENCE TO RELATED APPLICATION

This application claims the priority benefit of Taiwan application serial no. 88123298, filed Dec. 30, 1999.

BACKGROUND OF THE INVENTION

1. Field of the Invention

The present invention relates to a method of forming a pattern. More particularly, the present invention relates to a method of forming a rectangular pattern.

2. Description of the Related Art

Photolithographic and etching operations are the two most commonly used processes for forming patterns on a semiconductor wafer. In a conventional photolithographic process, photoresist material is first deposited over a substrate. The photoresist material is then exposed to light through a photomask so that the pattern on the photomask is transferred to the photoresist layer. Finally, the exposed photoresist layer is developed to form a patterned photoresist layer.

Due to fierce competition in the market place, semiconductor manufacturers are all aiming for higher level of integration. Various mechanical means for increasing the level of integration are thereby developed. As VLSI technologies continue to progress, all kinds of problems resulting from a reduction of line width must be solved. To resolve the problems arising in a photolithographic operation, various types of exposure stations using a variety of light sources including G-line, I-line, deep ultraviolet (DUV) and laser are now available. Nevertheless, there are still some limitations to forming perfect rectangular patterns.

FIG. 1 is a sketch showing the rounded corners of an originally rectangular pattern after a conventional photolithographic operation. As shown in FIG. 1, the four right-angled corners of a rectangular pattern 100 are truncated into a pseudo-rectangular pattern with four rounded corners 120 after a pattern transfer operation. In the fabrication of deep sub-micron devices, corner rounding of rectangular patterns is likely to intensify and production yield is likely to drop. The rounding of corners will improve if a better exposure station such as a deep ultraviolet stepper or a machine using an optical proximity correction (OPC) method is used. However, choosing an ultraviolet stepper or a machine that employs the OPC method can at most reduce the degree of rounding. To eliminate corner rounding altogether, some fundamental processing changes have to be introduced.

SUMMARY OF THE INVENTION

The invention provides a patterning method suitable for forming a rectangular pattern in a material layer above a substrate. A hard mask layer is formed over the material layer. A first patterned photoresist layer is formed over the hard mask layer. A first etching operation is next conducted to remove a portion of the hard mask layer not covered by the first patterned photoresist layer so that the pattern in the first photoresist layer is transferred to the hard mask layer. The first photoresist layer is removed. A second patterned photoresist layer is formed over the substrate. A portion of the pattern in the second photoresist layer overlaps with portions of the pattern in the first photoresist layer to form overlapping regions. These overlapping regions form a pattern identical to the desired pattern in the material layer. While using the second patterned photoresist layer and the exposed hard mask as an etching mask, a second etching operation is conducted. Ultimately, a portion of the material layer covered by neither the patterned second photoresist layer nor the hard mask layer is removed. Hence, the desired pattern is transferred to the material layer.

According to a first embodiment of this invention, the aforementioned method of patterning the material layer can be applied to form a rectangular pattern in the material layer. The method includes forming a patterned first photoresist layer having a linear opening over the material layer. One side of the linear opening and a first side of the desired rectangular opening in the material layer are parallel to each other, and the linear opening corresponds in position to the desired rectangular opening in the material layer. The linear opening has a length greater than the first side of the desired rectangular opening and a width identical to the width of the second side of the desired rectangular opening. After carrying out an etching operation to transfer the linear opening pattern in the first photoresist layer to the material layer, a patterned second photoresist layer is formed over the material layer. The second photoresist layer also contains a linear opening that corresponds in position to the desired rectangular opening in the material layer. However, one side of this linear opening is parallel to the second side of the desired rectangular opening. The linear opening has a width identical to the second side of the desired rectangular opening and a length greater than the second side of the desired rectangular opening. After a second etching operation is carried out to transfer the pattern in the second photoresist layer to the material layer, a rectangular opening pattern is transferred to the material layer.

The material layer having a rectangular opening therein can be used as a mask layer for forming a rectangular isolation structure. For example, while using the material layer as a mask, thermal oxidation of a substrate can be carried out to form a device isolation structure. Alternatively, the substrate can be etched to form a trench while using the material layer as an etching mask so that a rectangular trench isolation structure may subsequently form in the substrate.

The invention also provides a second patterning method suitable for forming a rectangular pattern in a material layer above a substrate. A hard mask layer is formed over the material layer. A first patterned photoresist layer is formed over the hard mask layer. A first etching operation is conducted to remove a portion of the hard mask layer not covered by the first photoresist layer so that the pattern on the first photoresist layer is transferred to the hard mask layer. The first photoresist layer is removed. A second patterned photoresist layer is formed over the substrate. A portion of the pattern on the second photoresist layer overlaps with portions of the pattern on the first photoresist layer to form overlapping regions. These overlapping regions form a pattern identical to the desired pattern in the material layer. While using the second patterned photoresist layer as an etching mask, a second etching operation is conducted so that a portion of the hard mask layer not covered by the patterned second photoresist layer is removed. Hence, the desired pattern is transferred to the hard mask layer. The second photoresist layer is removed, and then a third etching operation is conducted to transfer the desired pattern to the material layer while using the patterned hard mask layer as an etching mask.

According to a second embodiment of this invention, the aforementioned method of patterning the material layer can be applied to the formation of a rectangular island pattern in the material layer. The method includes forming a patterned first photoresist layer over the material layer. The pattern in the first photoresist layer is a linear island having one side parallel to a first side of the desired rectangular island pattern. The linear island is formed in a corresponding position above the desired rectangular island. Length of the linear island in the first photoresist layer is greater than the first side of the desired rectangular island pattern while width is identical to the second side of the desired rectangular island pattern. After carrying out a first etching operation to transfer the pattern in the first photoresist layer onto the material layer, a patterned second photoresist layer is formed over the material layer. The pattern in the second photoresist layer is in the shape of a rectangular island formed in a corresponding position above the desired rectangular island pattern. The first side of this rectangular island has a length identical to the first side of the desired rectangular island pattern while the second side has a length greater than the second side of the desired rectangular island pattern. A second etching operation is then carried out to transfer the pattern in the second photoresist layer onto the hard mask layer. Finally, a third etching operation is conducted to transfer the patterned hard mask onto the material layer, forming the desired rectangular island pattern in the material layer.

The rectangular island pattern on the material layer can be used for patterning a silicon nitride hard mask layer to form a rectangular-shaped active region in a substrate. For example, in local oxidation or shallow trench isolation to form an isolation structure that defines a rectangular active region, the rectangular island pattern in the material layer can be transferred to the silicon nitride layer. The silicon nitride layer is then used to perform a thermal oxidation. Alternatively, the silicon nitride layer can be used as a mask in an etching process.

Accordingly, the present invention provides a method capable of eliminating the rounding of comers after a rectangular pattern is transferred from a photomask to a photoresist layer in a photolithographic operation. Hence, production yield is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
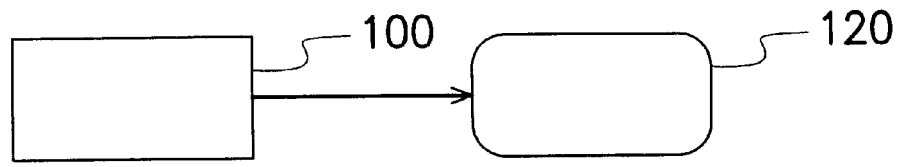
FIG. 1 is a sketch showing the rounding of corners of an original rectangular pattern after a conventional photolithographic operation.

Reference will now be made in detail to the present preferred embodiments of the invention, examples of which are illustrated in the accompanying drawings. Wherever possible, the same reference numbers are used in the drawings and the description to refer to the same or like parts.

The method of this invention is capable of patterning out a rectangular opening or a rectangular island in a material layer. In the first embodiment of this invention, the formation of a rectangular isolating structure in a substrate is chosen as an example for forming a rectangular opening in the material layer. In the second embodiment of this invention, the formation of a rectangular active region in the substrate is chosen as an example for forming a rectangular island in the material layer.

Figure 2:
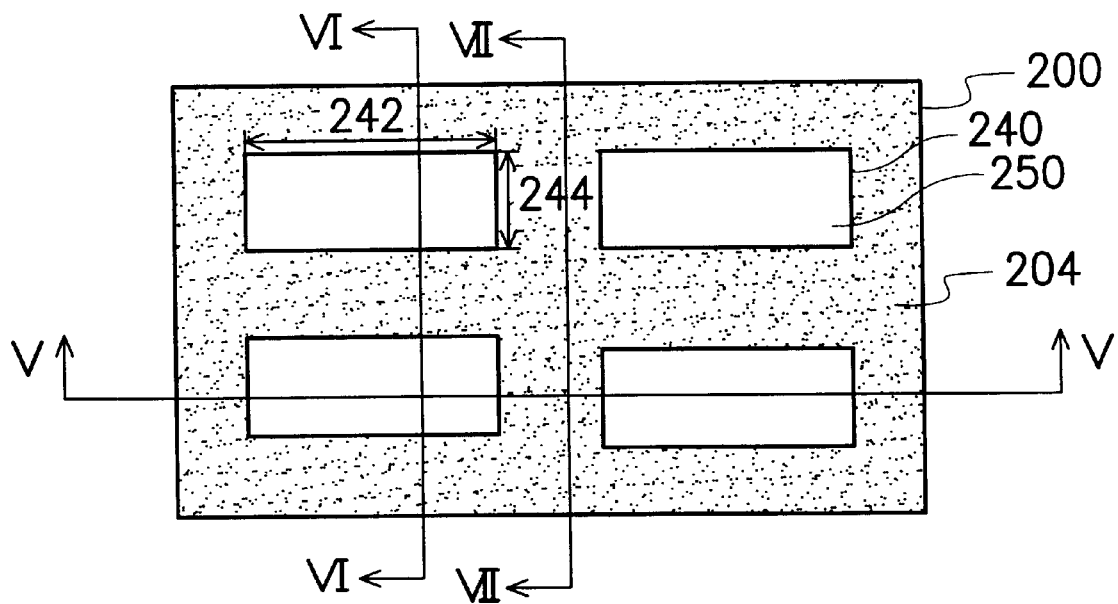
FIG. 2 is a schematic top view showing the desired rectangular isolation structures in a substrate formed according to the first embodiment of the invention.

FIG. 2 is a schematic top view showing the desired rectangular isolation structures in a substrate formed according to the first embodiment of the invention. FIGS. 5A through 5G are schematic, cross-sectional views along line V—V of FIG. 2 showing the progression of steps for producing the desired rectangular isolation structures. FIGS. 6A through 6G are schematic, cross-sectional views along line VI—VI of FIG. 2 showing the progression of steps for producing the desired rectangular isolation structures. FIGS. 7A through 7G are schematic, cross-sectional views along line VII—VII of FIG. 2 showing the progression of steps for producing the desired rectangular isolation structures.

As shown in FIG. 2, the method of this invention is capable of forming a rectangular isolation structure 250 in a substrate 200. According to conventional local oxidation method or shallow trench isolation process, a mask layer 204 having a rectangular opening 240 has to be formed over the substrate 200 first. The mask layer 240 is subsequently used as an oxidation mask in local oxidation or an etching mask for forming a trench in the substrate 200. Ultimately, the isolation structure is formed within the rectangular opening 240.

In the first embodiment of this invention, a method of patterning out the rectangular opening 240 in the mask (material) layer 204 is provided. First, as shown in FIGS. 2, 5A, 6A and 7A, a pad oxide layer 202, a material layer 204 and a hard mask layer 206 are sequentially formed over a substrate 200. Etching rates for the hard mask layer 206 and the material layer 204 are different; etching rates for the material layer 204 and the pad oxide layer 202 or the material layer 204 and the substrate 200 are also different. The material layer 204 is shown in FIG. 2 as the mask layer 204. In this invention, a pattern containing a rectangular opening 240 is formed in this material layer 204 so that the material layer 204 can be used as a mask layer in a subsequent processing step. The area 238 inside the material layer 204 enclosed by dashed lines is the location in which the desired rectangular opening 240 is formed.

The pad oxide layer 202 having a thickness of about 100 Å to 200 Å can be formed by, for example, thermal oxidation. The material layer 204 can be a silicon oxide layer having a thickness of about 1500 Å to 2000Å formed by, for example, chemical vapor deposition. The hard mask layer 206 having a thickness of about 600 Å to 900 Å can be a silicon oxide layer formed by, for example, chemical vapor deposition using tetra-ethyl-ortho-silicate (TEOS) as a source gas.

Figure 3:
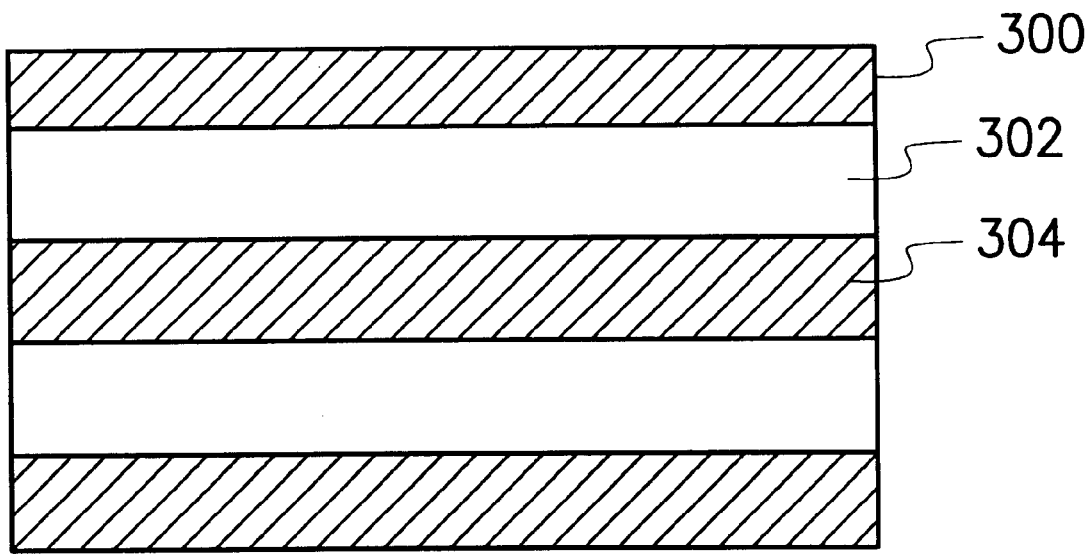
FIG. 3 is a sketch of the photomask for producing a pattern in the first photoresist layer according to the first embodiment of the invention.
Figure 5A:
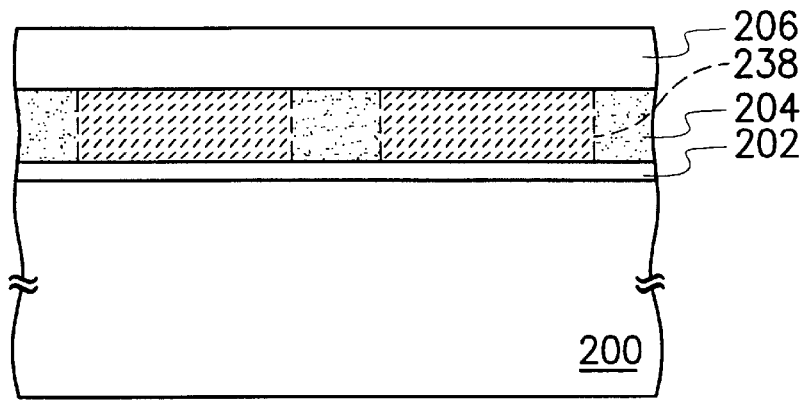
FIGS. 5A through 5G are schematic, cross-sectional views along line V—V of FIG. 2 showing the progression of steps for producing the desired rectangular isolation structures.
Figure 5B:
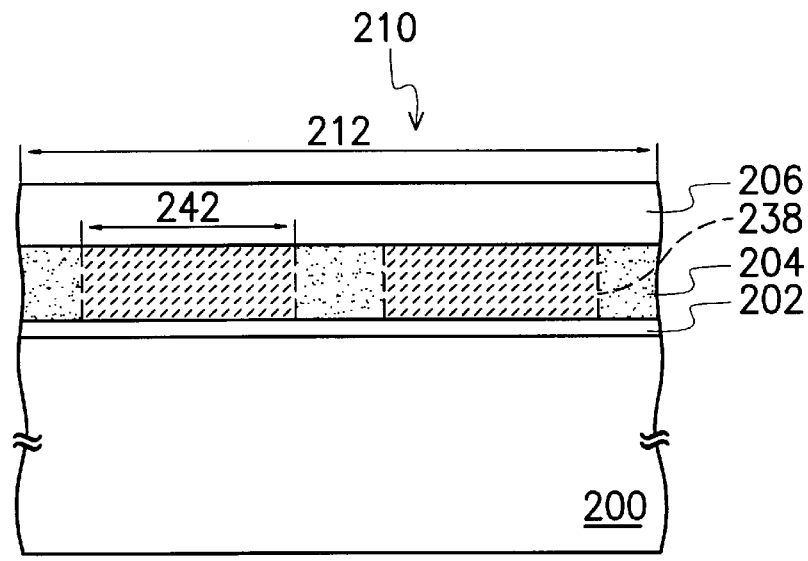
Figure 6A:
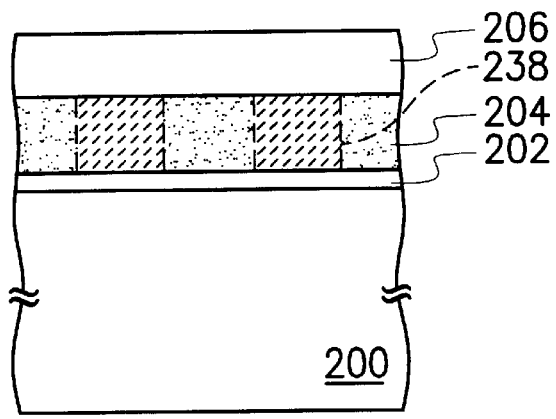
FIGS. 6A through 6G are schematic, cross-sectional views along line VI—VI of FIG. 2 showing the progression of steps for producing the desired rectangular isolation structures.
Figure 6B:
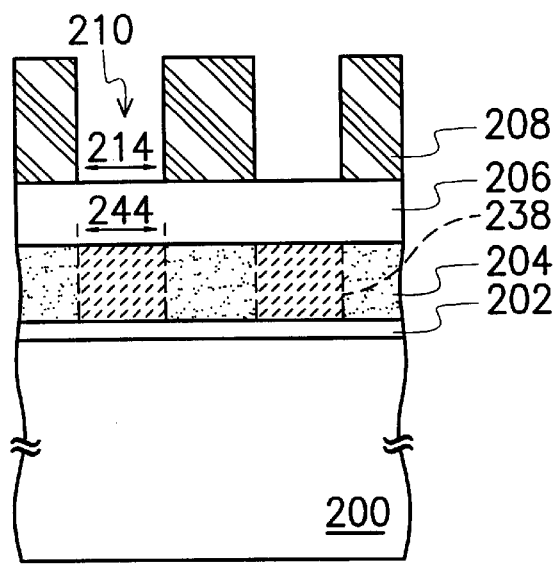
Figure 7A:
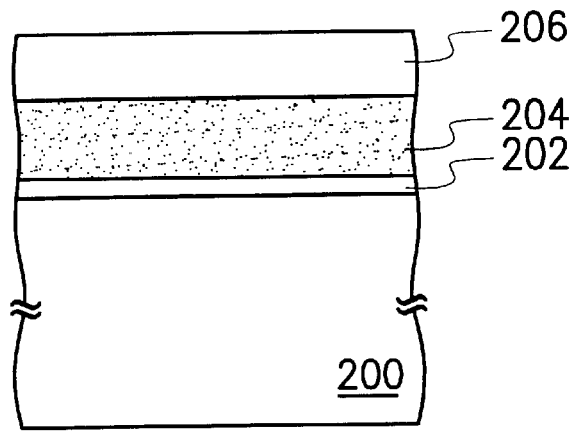
FIGS. 7A through 7G are schematic, cross-sectional views along line VII—VII of FIG. 2 showing the progression of steps for producing the desired rectangular isolation structures.
Figure 7B:
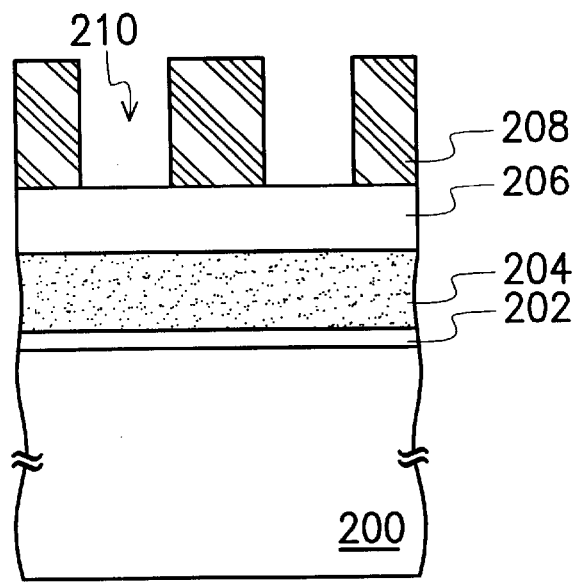

Reference is made to FIGS. 5B, 6B and 7B. A patterned photoresist layer 208 is formed over the hard mask layer 206. The pattern in the photoresist layer 208 is transferred from a photomask 300 shown in FIG. 3. A pattern 302 on the photomask 300 permits the formation of linear openings 210 in the photoresist layer 208. For example, if the photoresist layer 208 is made from positive photoresist material, the linear pattern 302 on the photomask 300 should be a light transparent region while areas 304 outside the linear pattern 302 should be opaque regions. In general, a chromium film is coated over the photomask in the opaque regions. In a photo exposure operation, a portion of the photoresist layer 208 that corresponds to the linear pattern 302 of the photomask 300 is exposed to light so that bonds are broken. After development, the exposed photoresist layer 208 dissociates to form the linear openings 210.

The linear opening 210 is formed above the area 238 where the desired rectangular opening 240 is formed. One side of the linear opening 210 is parallel to the side 242 of the desired rectangular opening. Length 212 of the linear opening 210 is greater than the length 242 on one side of the desired rectangular opening 240. Width 214 of the linear opening 210 is identical to the width 244 of the other side of the desired rectangular opening 240. The length 212 of the linear opening 210 must at least be long enough to eliminate the corner rounding effect of the photolithographic operation. In other words, arcs are normally formed in the corner region of the linear opening 210 after a photolithographic operation. However, as long as the remaining length of the linear opening 210 after deducting the arc lengths is greater than the length 242 of the desired rectangular opening 240, the spirit of this invention is not violated.

In FIG. 2, four rectangular isolation structures 240 arranged two in a row are included. Hence, overall length 212 of the linear opening 210 in the photoresist layer 208 must cover at least twice the length 242 of a desired rectangular opening 240.

Figure 5C:
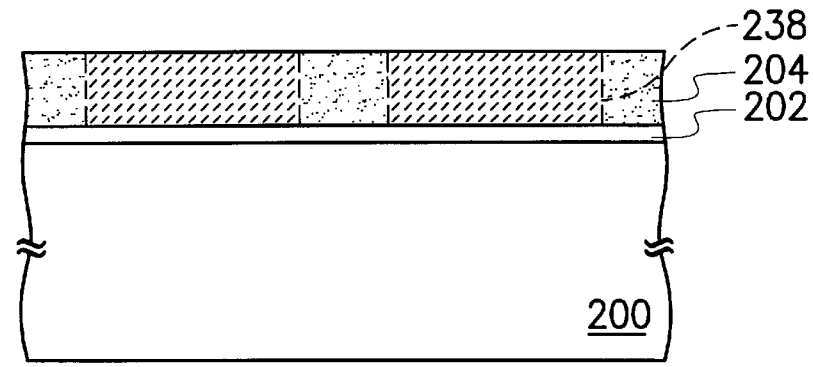
Figure 6C:
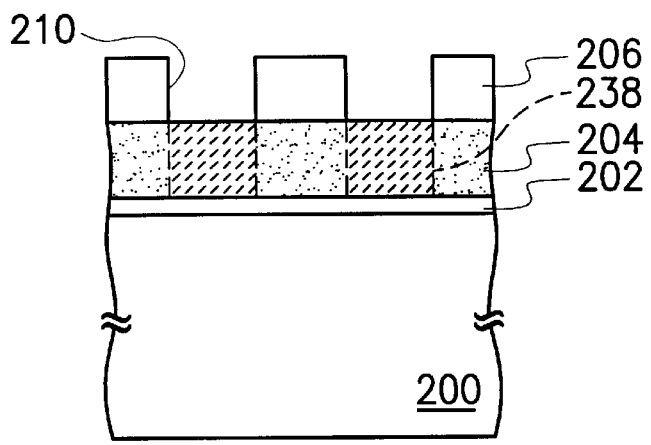
Figure 7C:
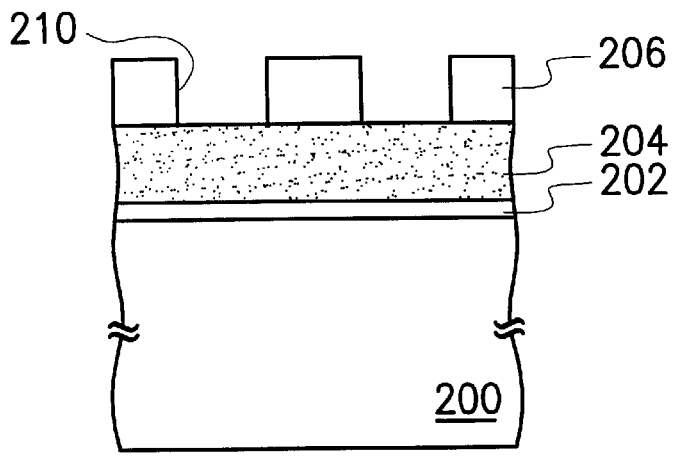

As shown in FIGS. 5C, 6C and 7C, etching, such as anisotropic dry etching, is conducted to remove a portion of the hard mask layer 206 while using the photoresist layer 208 as an etching mask. Hence, the linear opening pattern in the photoresist layer 208 is transferred to the hard mask layer 260. After the etching operation, the photoresist layer 208 is removed.

Figure 4:
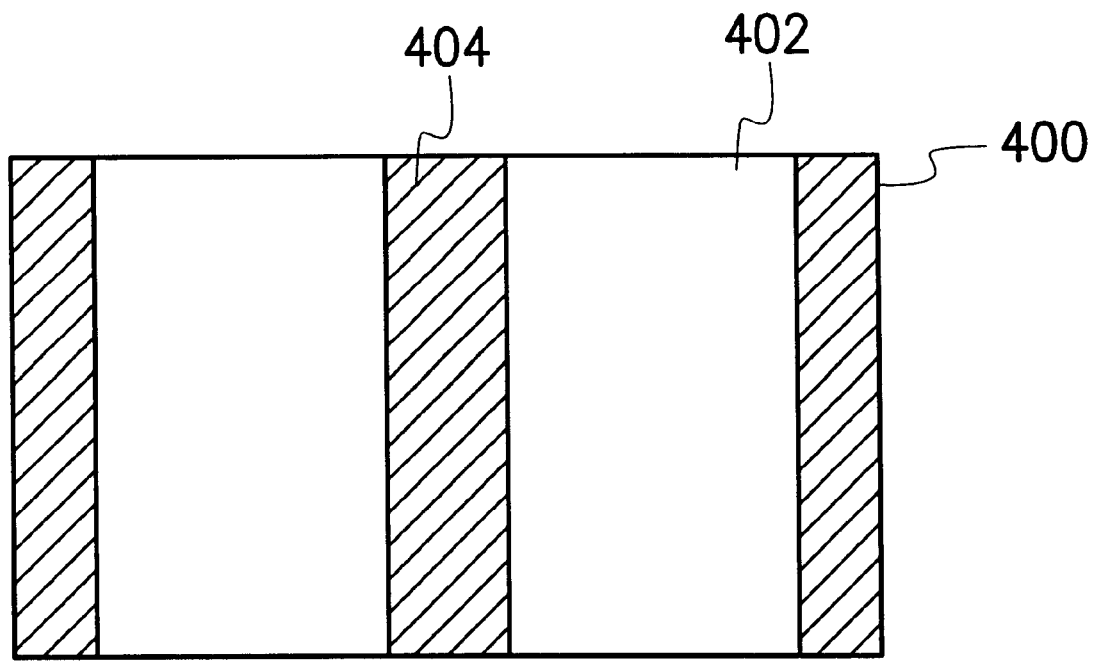
FIG. 4 is a sketch of the photomask for producing a pattern in the second photoresist layer according to the first embodiment of the invention.
Figure 5D:
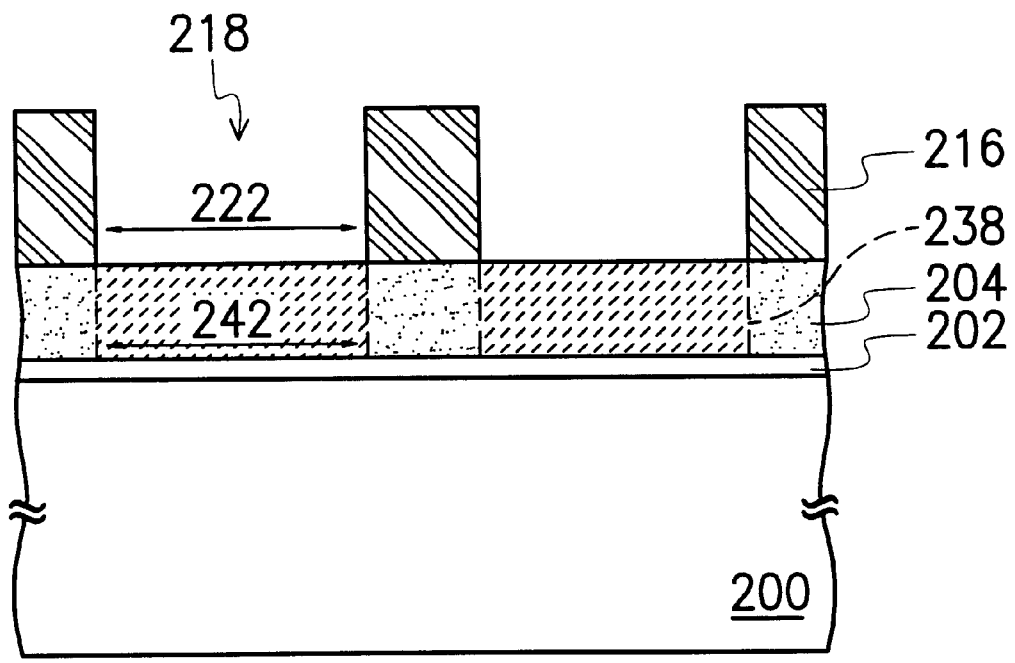
Figure 6D:
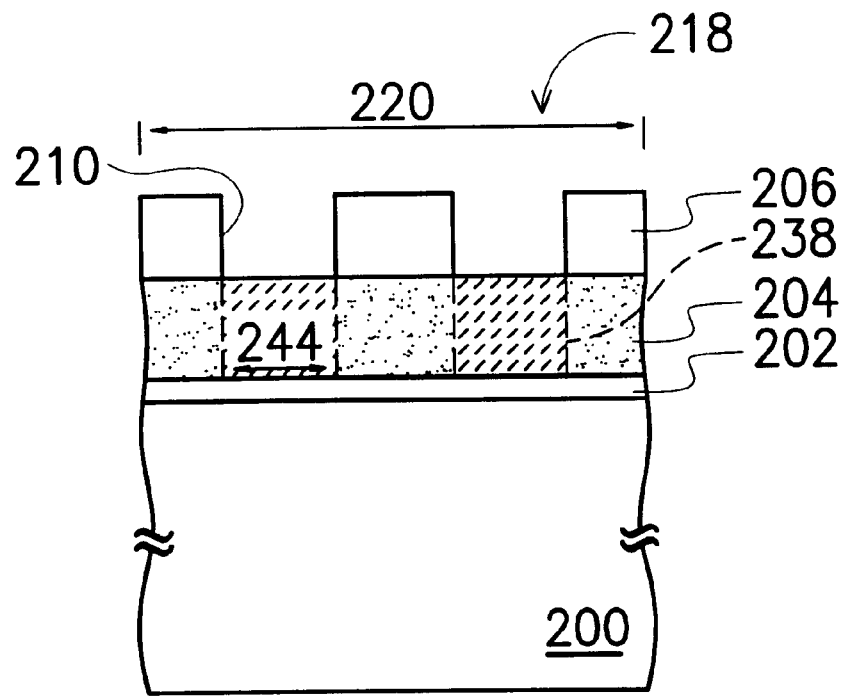
Figure 7D:
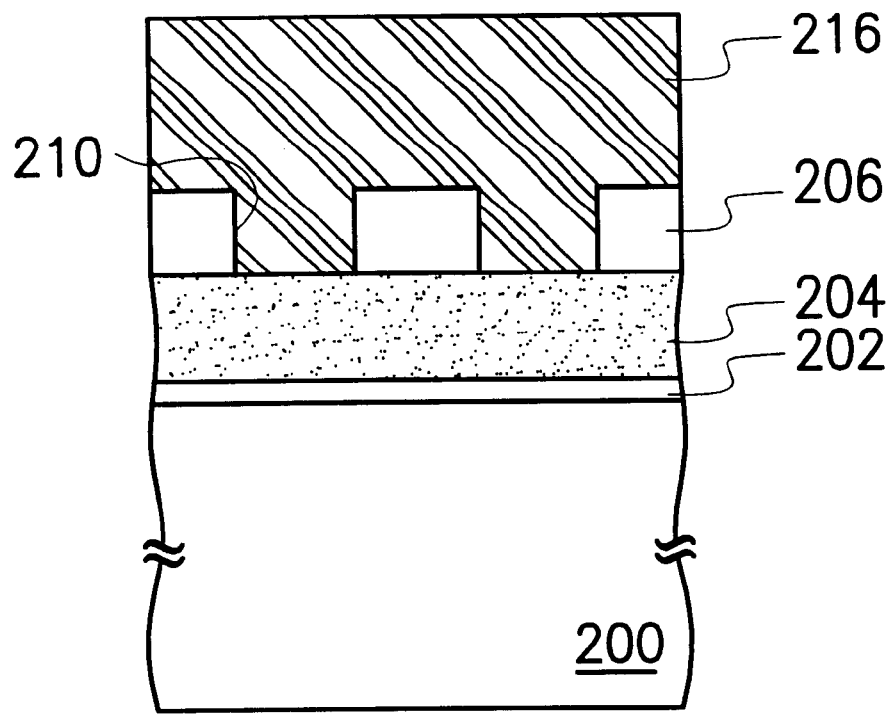

Reference is made to FIGS. 5D, 6D and 7D. Another patterned photoresist layer 216 is formed over the substrate 200. The pattern in the photoresist layer 216 is transferred from a photomask 400 shown in FIG. 4. A pattern 402 on the photomask 400 permits the formation of linear openings 218 in the photoresist layer 216. For example, if the photoresist layer 216 is made from positive photoresist material, the linear pattern 402 on the photomask 400 should be a light transparent region while areas 404 outside the linear pattern 402 should be opaque regions. In general, a chromium film is coated over the photomask in the opaque regions. In a photo exposure operation, a portion of the photoresist layer 216 that corresponds to the linear pattern 402 of the photomask 400 is exposed to light so that bonds are broken. After development, the exposed photoresist layer 216 dissociates to form the linear openings 218.

The linear opening 218 is formed above the area 238 where the desired rectangular opening 240 is to be formed. One side of the linear opening 218 is parallel to the side 244 of the desired rectangular opening 240. Length 220 of the linear opening 218 is greater than the length 244 of one side of the desired rectangular opening 240. Width 222 of the linear opening 218 is identical to the width 242 of the other side of the desired rectangular opening 240. Similarly, the length 220 of the linear opening 218 must at least be long enough to remove the corner rounding effect due to photolithographic operation. In other words, arcs are normally formed in the corner region of the linear opening 218 after a photolithographic operation. As long as the remaining length of the linear opening 218 after deducting the arc lengths is greater than the length 244 of the desired rectangular opening 240, the spirit of this invention is not violated.

In FIG. 2, four rectangular isolation structures 240 arranged two in a row are included. Hence, overall length 220 of the linear opening 218 in the photoresist layer 216 must cover at least twice the length 244 of a desired rectangular opening 240.

Figure 8:
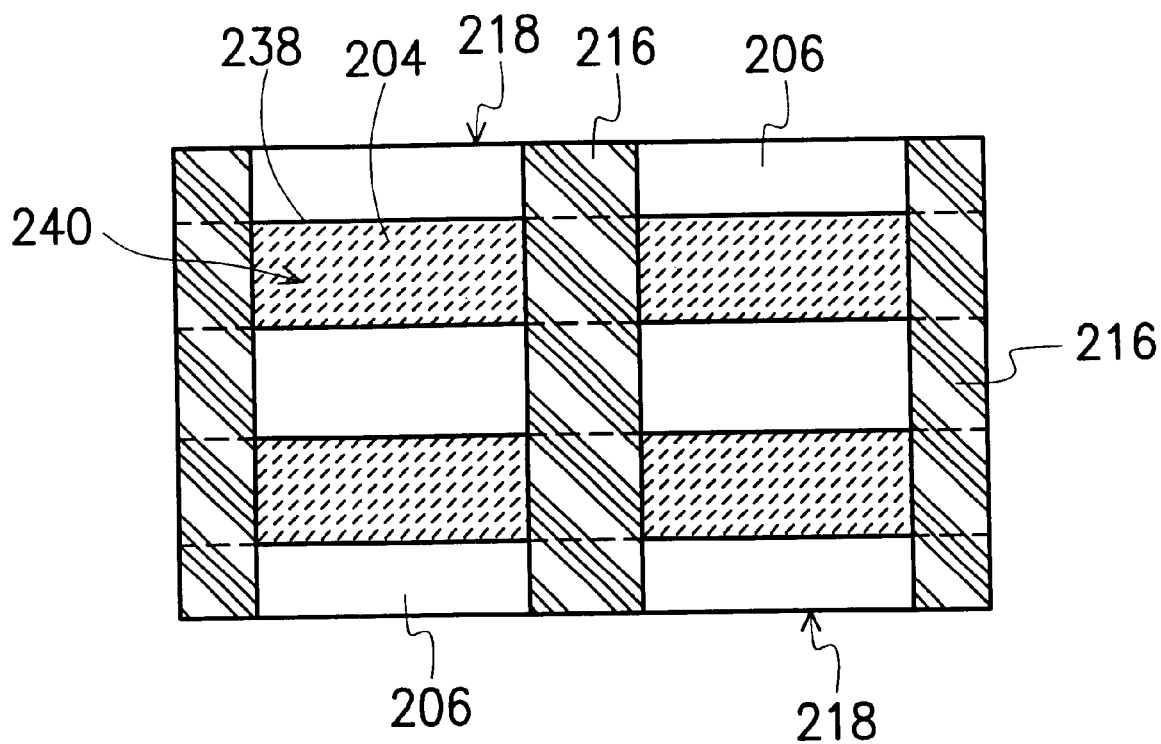
FIG. 8 is a top view of FIGS. 5D, 6D and 7D.

FIG. 8 is a top view of FIGS. 5D, 6D and 7D. As shown in FIG. 8, the linear opening 218 in the photoresist layer 216 exposes a portion of the hard mask layer 206 and the material layer 204. The exposed material layer 204 corresponds to the areas 238 for forming the desired rectangular openings 240. In fact, each of these areas 238 is the an overlapping region between the linear opening 210 of the first photoresist layer 208 and the linear opening 218 of the second photoresist layer 216. The areas 238 are now enclosed by the photoresist layer 216 and the hard mask layer 206.

Figure 5E:
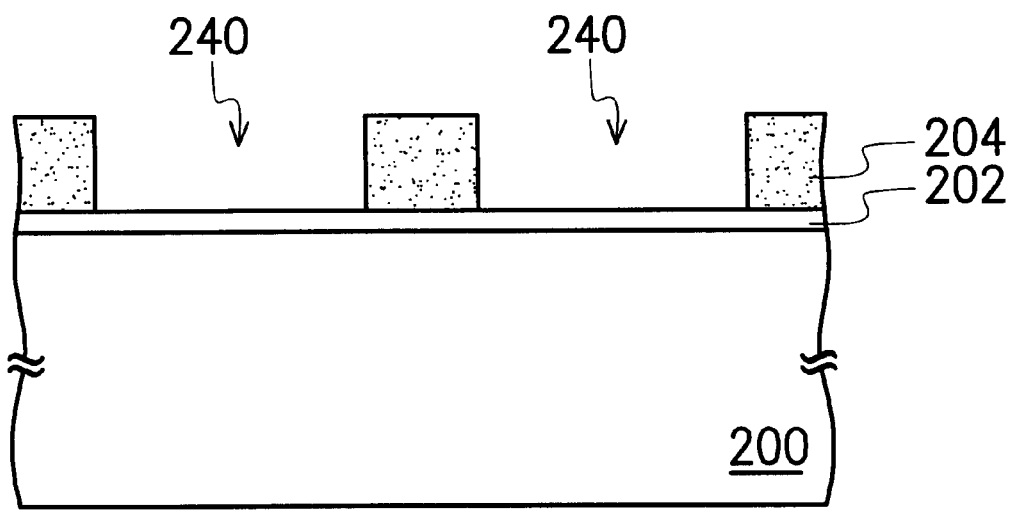
Figure 6E:
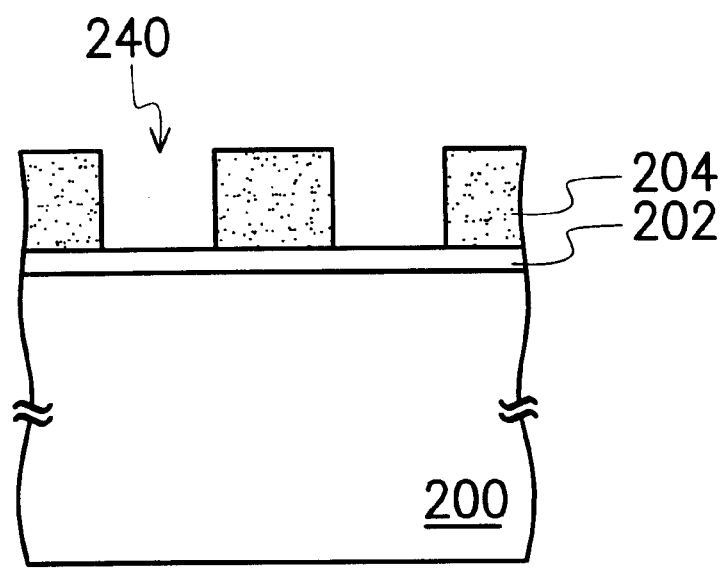
Figure 7E:
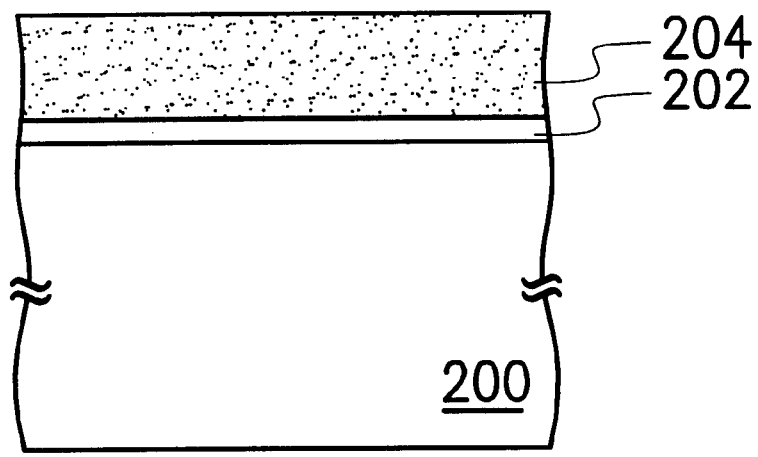

As shown in FIGS. 5E, 6E and 7E, etching, such as an anisotropic dry etching, is carried out to remove a portion of the material layer 204 while using the photoresist layer 216 and the hard mask layer 206 as an etching mask. In other words, material inside the area 238 (enclosed by dashed lines) for forming the desired rectangular opening 240 is removed. An anisotropic etching process that uses an etchant having a higher etching rate for the material layer 204 than the hard mask layer 206 is preferably chosen. For example, an etchant having an etching selectivity ratio between silicon nitride and silicon oxide of 3 may be chosen. After the etching step, the photoresist layer 216 and the remaining hard mask layer 206 are removed. Consequently, a rectangular opening 240 is formed in the material layer 204. This rectangular opening 240 exposes a portion of the pad oxide layer 202.

Figure 5F:
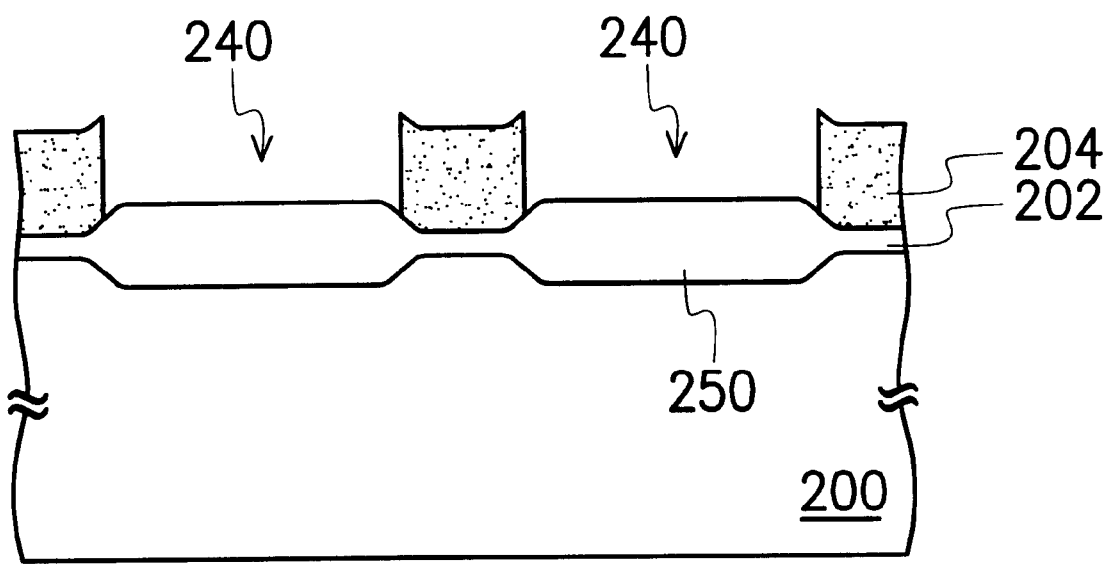
Figure 5G:
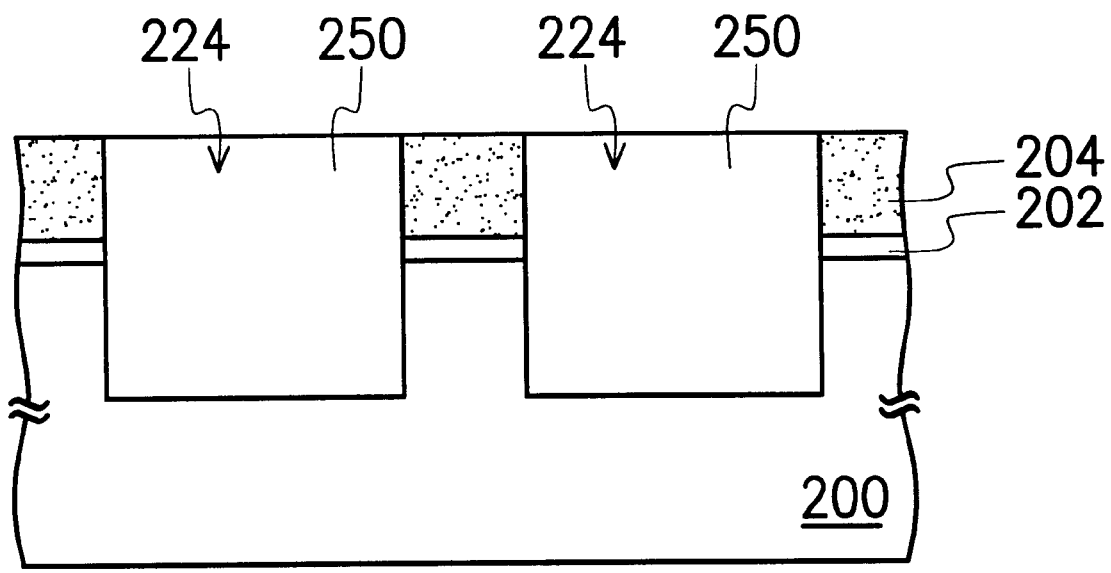
Figure 6F:
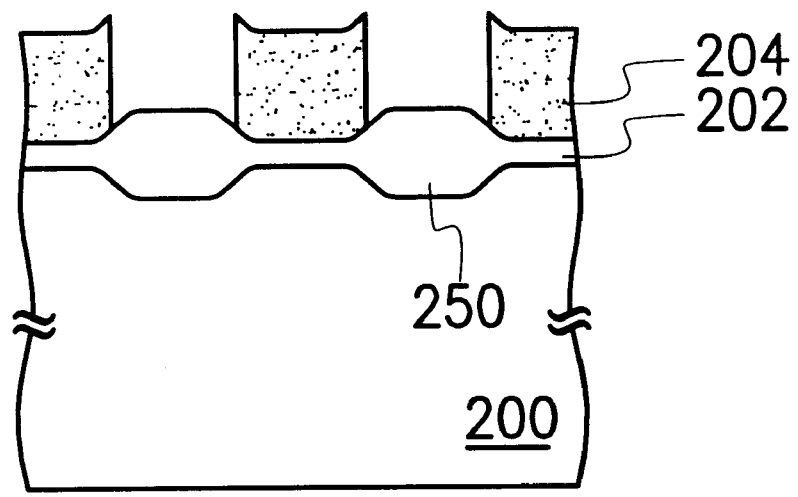
Figure 6G:
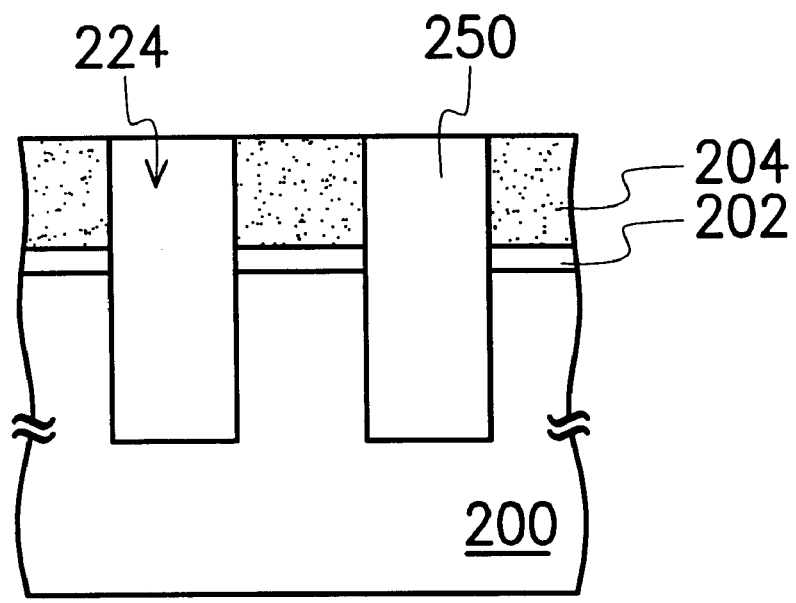
Figure 7F:
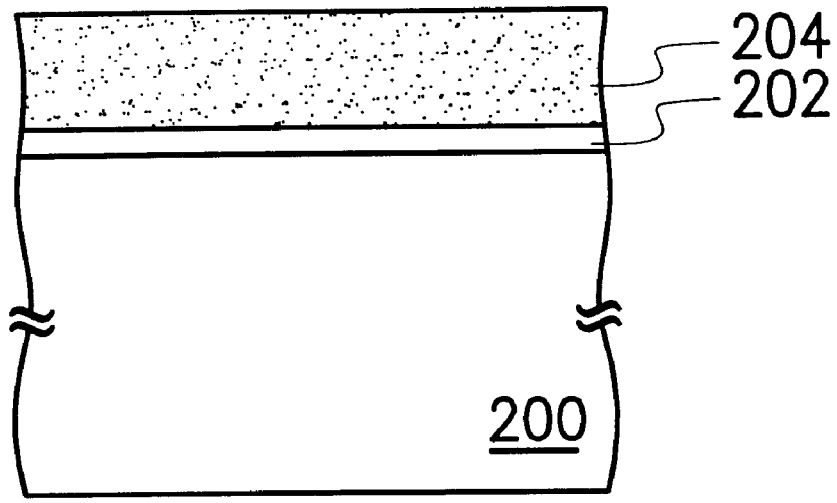
Figure 7G:
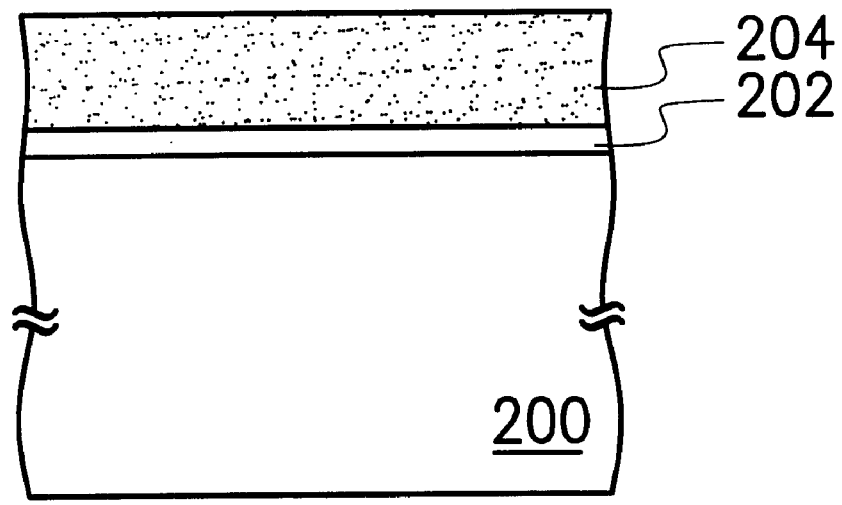

Thereafter, while using the material layer 204 as a mask, local oxidation method or shallow trench isolation method may be applied to form isolation structures 250 in the substrate 200. As shown in FIGS. 5F, 6F and 7F, thermal oxidation is carried out while using the material layer 204 as a mask to form isolation structures 250 in the substrate 200 that correspond in position to the rectangular opening 240. Alternatively, as shown in FIGS. 5G, 6G and 7G, a portion of the pad oxide layer 202 and the substrate 200 exposed by the rectangular openings 240 in the material layer 204 are removed to form trenches 224. Insulation material is next deposited into the trenches 224 to form isolation regions 250.

Figure 9:
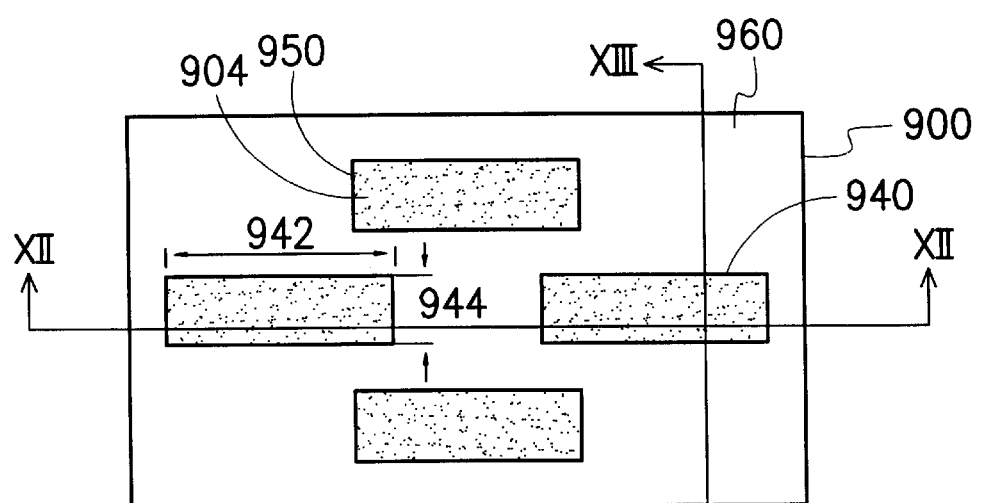
FIG. 9 is a schematic top view showing the desired rectangular active region in a substrate according to the second embodiment of this invention.

FIG. 9 is a schematic top view showing the desired rectangular active region in a substrate according to the second embodiment of this invention. FIGS. 12A through 12I are schematic, cross-sectional views along line XII—XII of FIG. 9 showing the progression of steps for producing the desired rectangular isolation structures. FIGS. 13A through 13I are schematic, cross-sectional views along line XIII—XIII of FIG. 9 showing the progression of manufacturing steps for producing the desired rectangular isolation structures.

As shown in FIG. 9, the method of this invention is capable of forming a rectangular active region 950 in a substrate 200. According to a conventional local oxidation method or shallow trench isolation process, a mask layer 904 having a rectangular island 940 has to be formed over the substrate 200 first. The mask layer 904 is subsequently used as an oxidation mask in local oxidation or an etching mask for forming a trench in the substrate 200. Ultimately, an isolation structure 960 is formed around the active region 950.

Figure 12A:
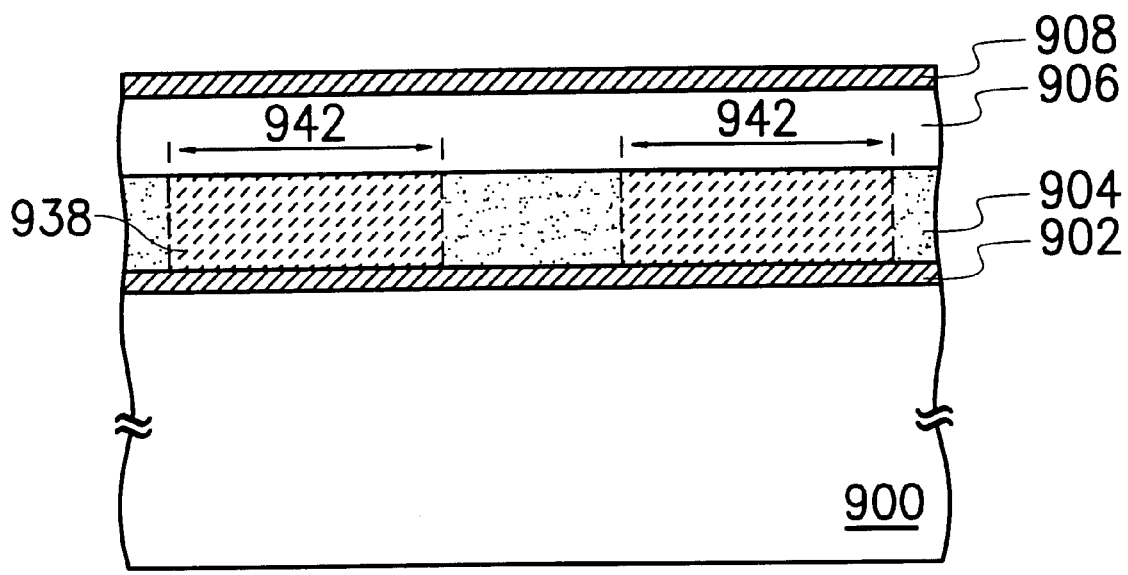
FIGS. 12A through 12I are schematic, cross-sectional views along line XII—XII of FIG. 9 showing the progression of steps for producing the desired rectangular isolation structures.
Figure 13A:
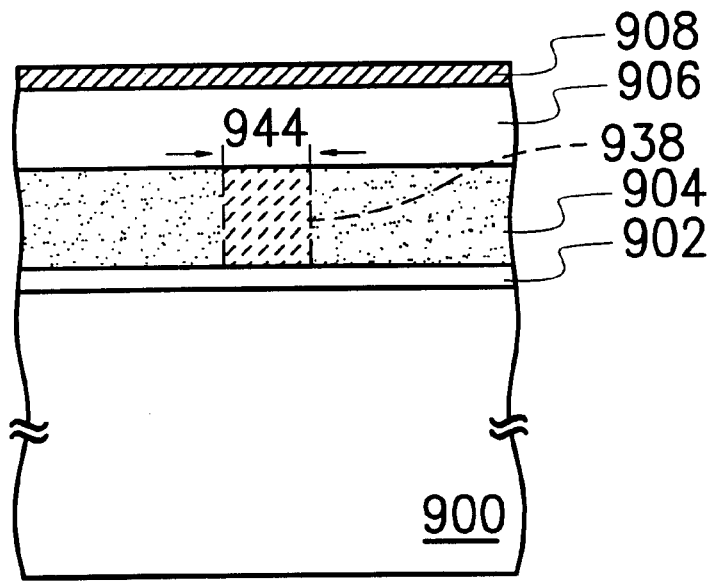
FIGS. 13A through 13I are schematic, cross-sectional views along line XIII—XIII of FIG. 9 showing the progression of manufacturing steps for producing the desired rectangular isolation structures.

In the second embodiment of this invention, a method of forming the rectangular island 940 in the mask (material) layer 904 is provided. First, as shown in FIGS. 9, 12A and 13A, a pad oxide layer 902, a material layer 904, a first hard mask layer 906 and a second hard mask layer 908 are sequentially formed over a substrate 900. Etching rates for the first hard mask layer 906 and the second hard mask layer 908 are different; etching rates for the first hard mask layer 906 and the material layer 904 are different; and, etching rates for the material layer 904 and the pad oxide layer 902 or the material layer 904 and the substrate 900 are also different. The material layer 904 is shown in FIG. 9 as the mask layer 904. In this invention, a pattern containing a rectangular island 940 is formed in this material layer 904 so that the material layer 904 can be used as a mask layer in a subsequent processing step. The area 938 inside the material layer 904 enclosed by dashed lines is the location in which the desired rectangular island 940 is to be formed.

Figure 10:
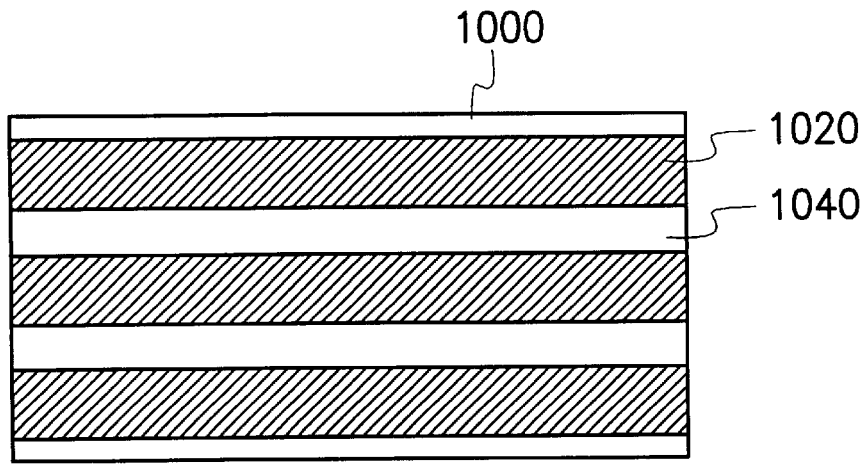
FIG. 10 is a sketch of the photomask for producing a pattern in the first photoresist layer according to the second embodiment of the invention.
Figure 12B:
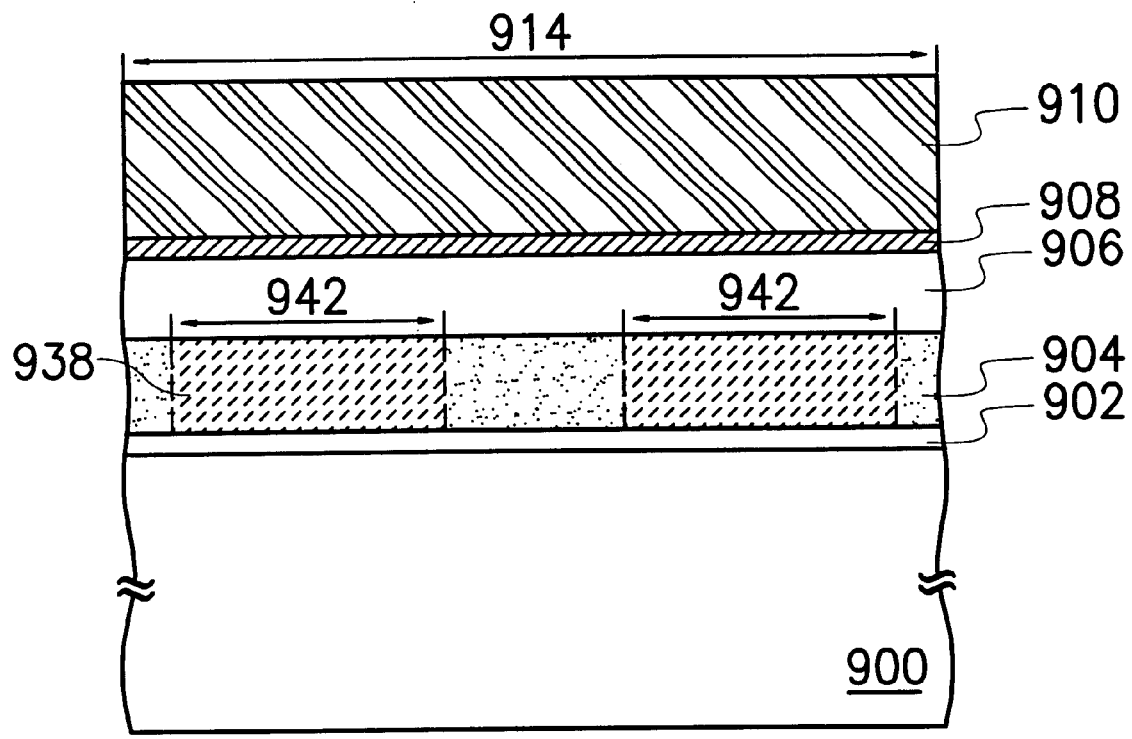
Figure 13B:
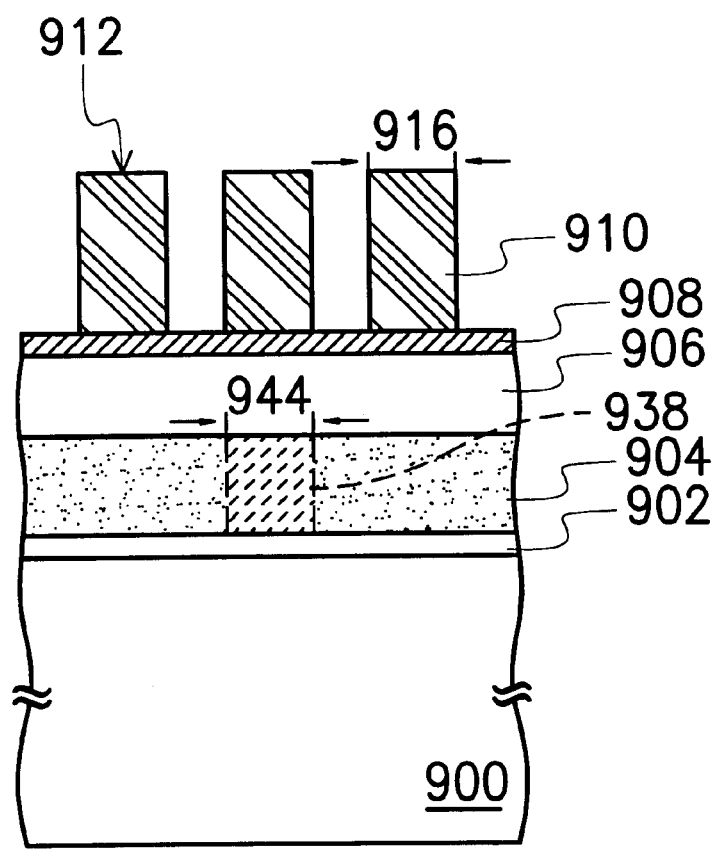

The pad oxide layer 902 having a thickness of about 100 Å to 200 Å can be formed by, for example, thermal oxidation. The material layer 904 can be a silicon nitride layer having a thickness of about 1500 Å to 2000 Å formed by, for example, chemical vapor deposition. The first hard mask layer 906 having a thickness of about 600 Å to 900 Å can be a silicon oxide layer formed by, for example, chemical vapor deposition using tetra-ethyl-ortho-silicate (TEOS) as a source of gas. The second hard mask layer 908 having a thickness of about 100 Å can be a polysilicon layer formed by, for example, chemical vapor deposition. As shown in FIGS. 9, 12B and 13B, a patterned photoresist layer 910 is formed over the hard mask layer 908. The pattern in the photoresist layer 910 is transferred from a photomask 1000 shown in FIG. 10. A pattern 1020 on the photomask 1000 permits the formation of linear islands 912 in the photoresist layer 910. For example, if the photoresist layer 910 is made from positive photoresist material, the linear island pattern 1020 on the photomask 1000 should be an opaque region while region 1040 outside the linear island pattern 1020 should be a light transparent region. In general, a chromium film is coated over the photomask in the opaque regions. In a photo exposure operation, a portion of the photoresist layer 208 that corresponds to the region 1040 outside the linear island pattern 1020 of the photomask 1000 is exposed to light so that bonds are broken. After development, the exposed photoresist layer 910 will dissociate to form a linear island 912.

The linear island 912 is formed above the area 938 for forming the desired rectangular island 940. One side of the linear island 912 is parallel to side 942 of the desired rectangular island 940. Length 914 of the linear island 912 is greater than the length 942 on one side of the desired rectangular island 940. Width 916 of the linear island 912 is identical to the width 944 on the other side of the desired rectangular opening 940.

Figure 12C:
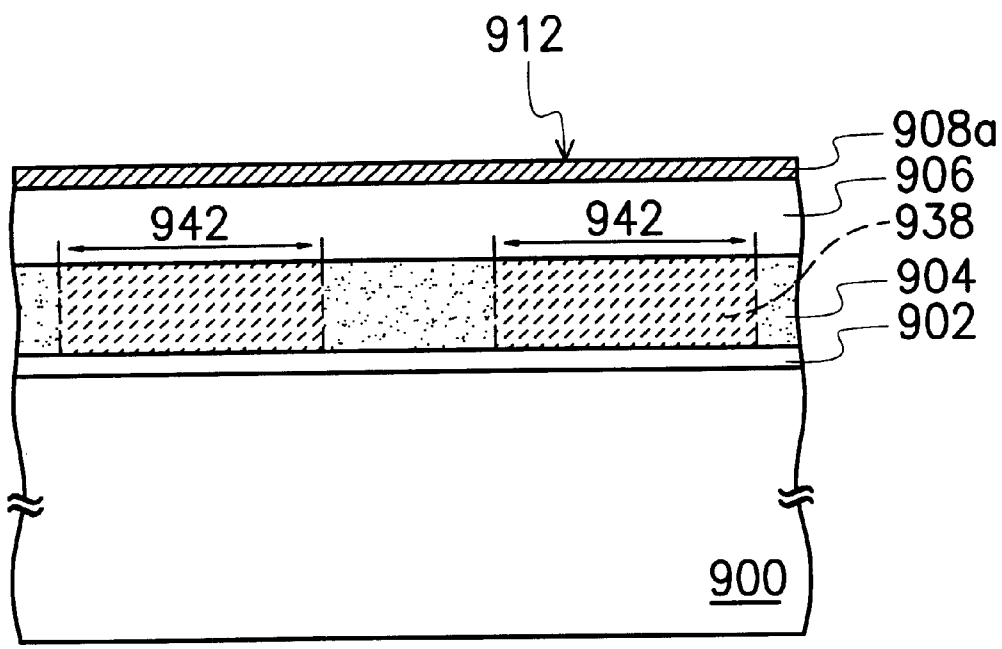
Figure 13C:
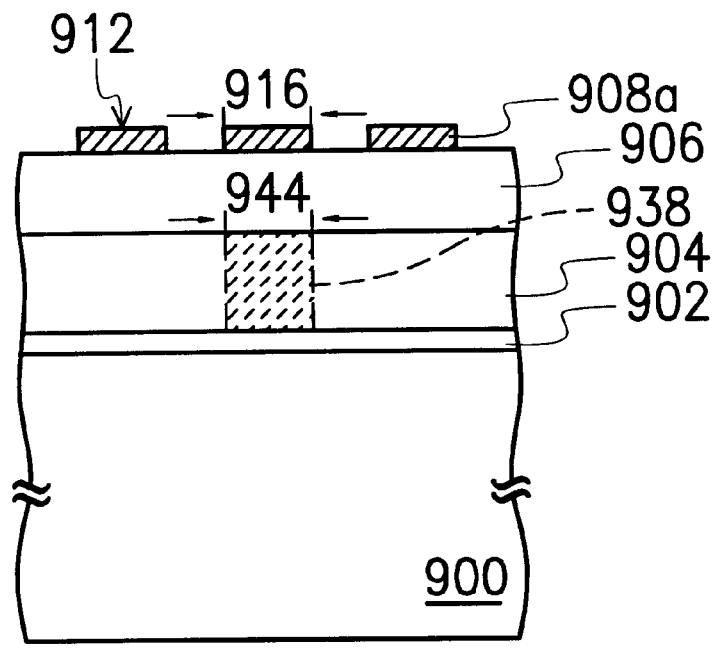

As shown in FIGS. 12C and 13C, etching, such as anisotropic dry etching, is conducted to remove a portion of the second hard mask layer 908 while using the photoresist layer 910 as an etching mask. Hence, the linear island pattern 912 in the photoresist layer 910 is transferred to the remaining hard mask layer 908a. After the etching operation, the photoresist layer 910 is removed.

Figure 11:
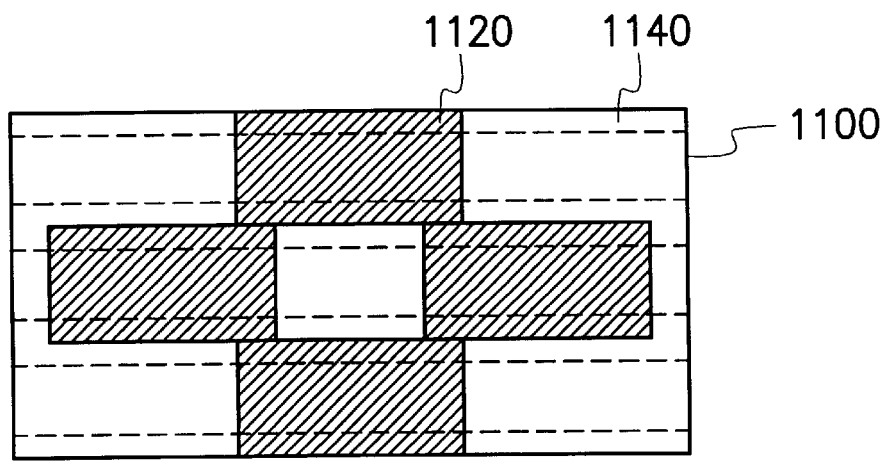
FIG. 11 is a sketch of the photomask for producing a pattern in the second photoresist layer according to the second embodiment of the invention.
Figure 12D:
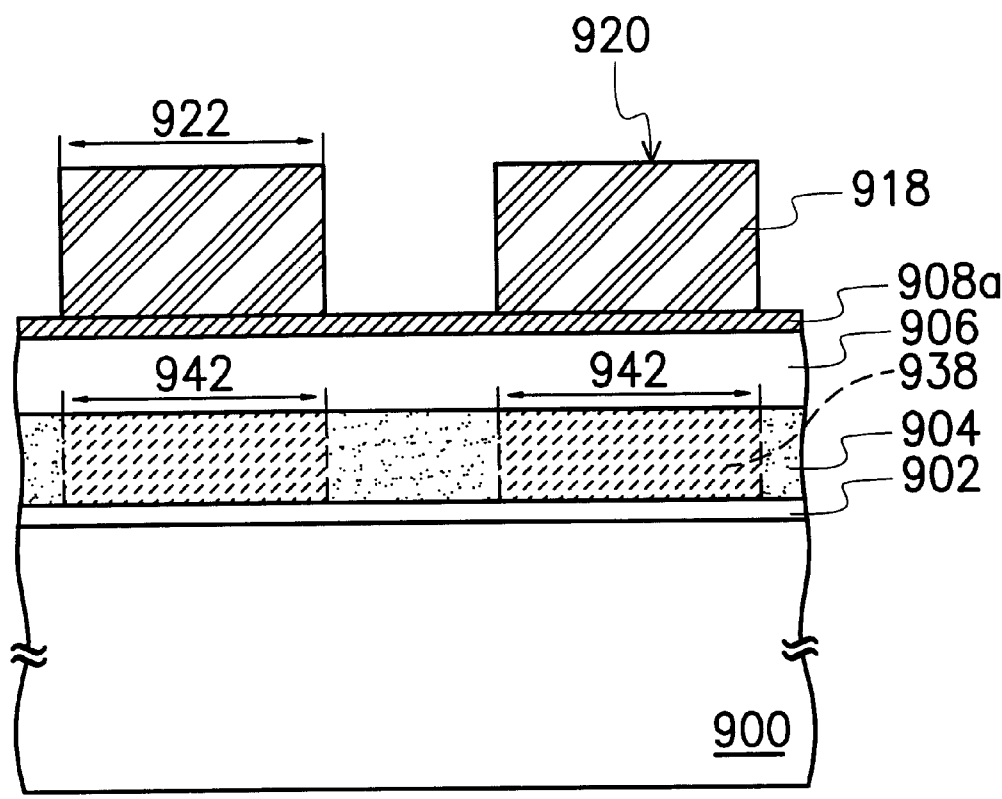
Figure 13D:
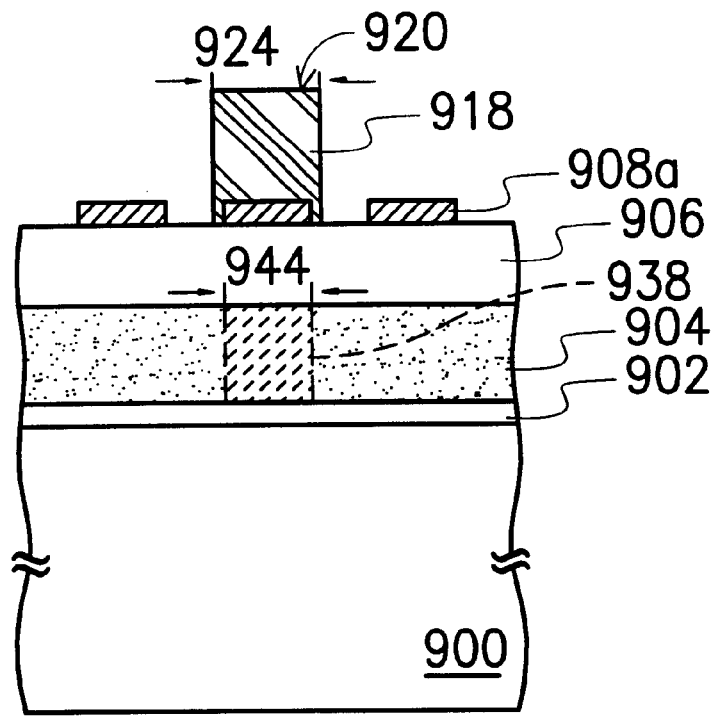

As shown in FIGS. 12D and 13D, another patterned photoresist layer 918 is formed over the substrate 900. The rectangular island pattern 920 in the photoresist layer 918 is transferred from a photomask 1100 shown in FIG. 11. The rectangular island pattern 1120 on the photomask 1100 permits the formation of rectangular island pattern 920 in the photoresist layer 918. The dashed lines in FIG. 11 indicate the positions of the linear island pattern 1020 in the first photomask 1000 with respect to the rectangular island pattern 920 in the photomask 1100. For example, if the photoresist layer 918 is made from positive photoresist material, the rectangular island pattern 1120 on the photomask 1100 should be an opaque region while region 1140 outside the rectangular island pattern 1120 should be a transparent region. In general, a chromium film is coated over the photomask in the opaque regions. In a photo exposure operation, some portion of the photoresist layer 216 that corresponds to the region 1140 outside the rectangular island pattern 1120 of photomask 1100 will be exposed to light so that bonds are broken. After development, the exposed photoresist layer 918 dissociates to form a rectangular island pattern 920.

The rectangular island pattern 920 is formed above the desired rectangular island pattern 940 (within region 938 enclosed by dashed lines). The first side of the rectangular island 920 has a length 922 identical to the length 942 of the first side of the desired rectangular island pattern 940. The second side of the rectangular island has a length 924 greater than the length 944 of the second side of the desired rectangular island 940.

Figure 14A:
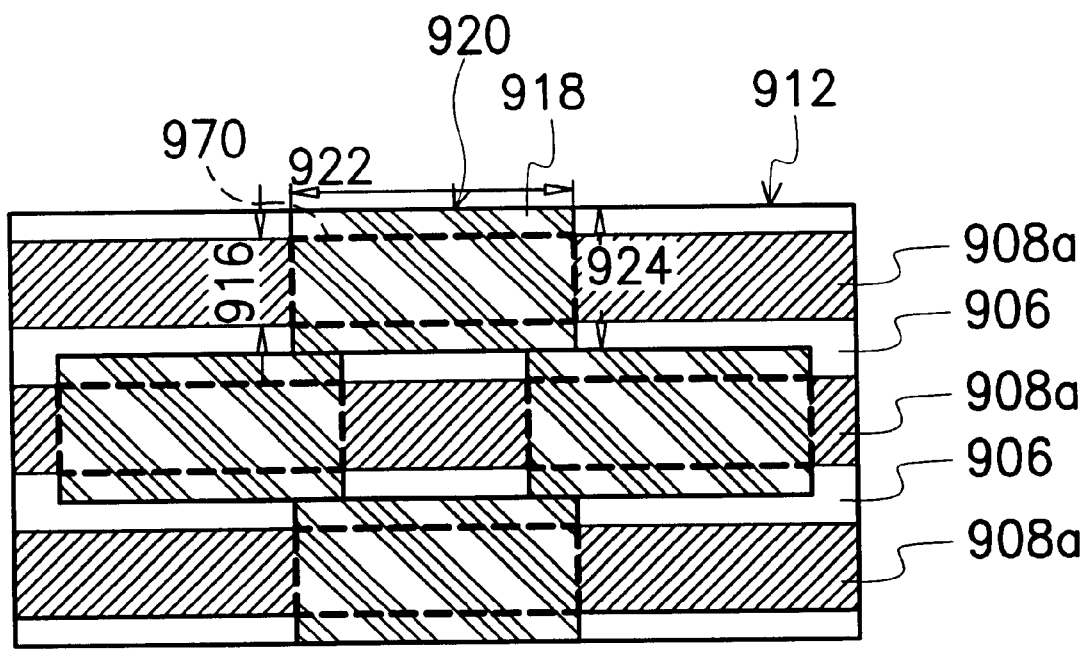
FIG. 14A is a top view of FIGS. 12D and 13D.

After the formation of patterned photoresist layer 918 over the substrate 900, a top view of the semiconductor device is shown in FIG. 14A. As shown in FIG. 14A, the rectangular islands 920 of the photoresist layer 918 covers a portion of the linear island shaped structures 912 of the second hard mask layer 908 and the first hard mask layer 906. The region 970 formed by the overlapping of the rectangular island 920 in the photoresist layer 918 and the linear island 912 in the second hard mask layer 908 is the desired rectangular active region 950 in FIG. 9. In other words, the overlap region 970 can be regarded as a common area covered by both the linear island pattern 912 of the first photoresist layer 910 and the rectangular island pattern 920 of the second photoresist layer 918.

Figure 12E:
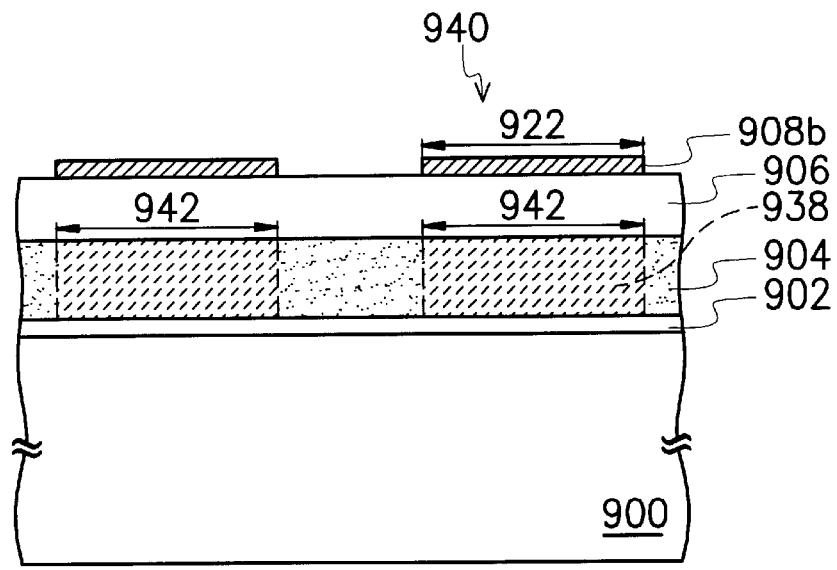
Figure 13E:
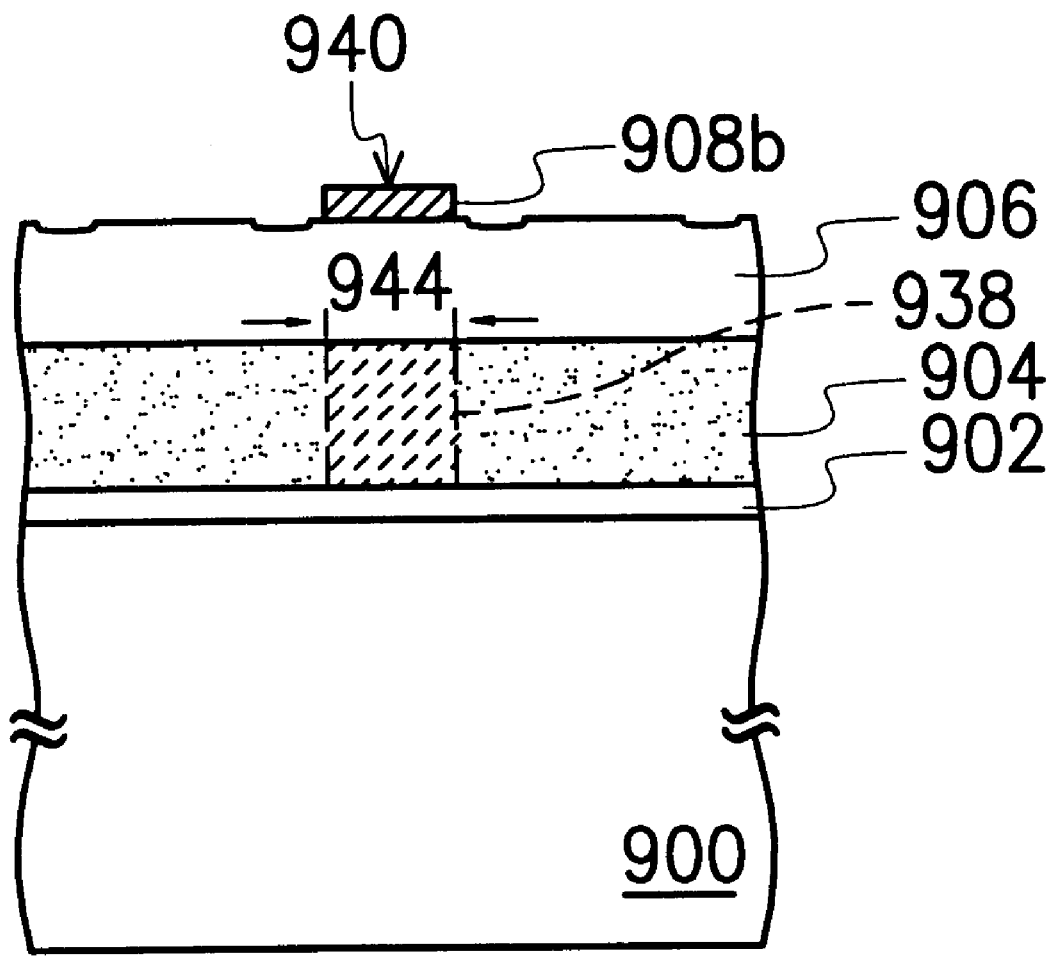

As shown in FIGS. 12E and 13E, an etching operation such as an anisotropic dry etching operation is carried out to remove a portion of the hard mask layer 908 while using the photoresist layer 918 as an etching mask. Thereafter, the photoresist layer 918 is removed. Because the rectangular island pattern 920 of the photoresist layer 918 is capable of covering the entire portion of hard mask layer 908a where the desired rectangular island 940 is formed, proper dimensions can be maintained even after the hard mask layer 908a is etched. Hence, the remaining hard mask layer 908b still contains the desired rectangular island pattern 940 whose top view is shown in FIG. 14B.

In addition, since the hard mask layer 908a and the hard mask layer 906 are made from different materials, an etchant having a good etching selectivity for the two hard mask layers can be used in the above etching operation. If the hard mask layer 908a is polysilicon and the hard mask layer 906 is a silicon oxide layer, for example, an etchant having an etching selectivity ratio between the two of up to 100:1 can be found. In other words, when the hard mask layer 908a is being patterned into a rectangular island hard mask layer 908b, the hard mask layer 906 can remain intact.

Figure 14B:
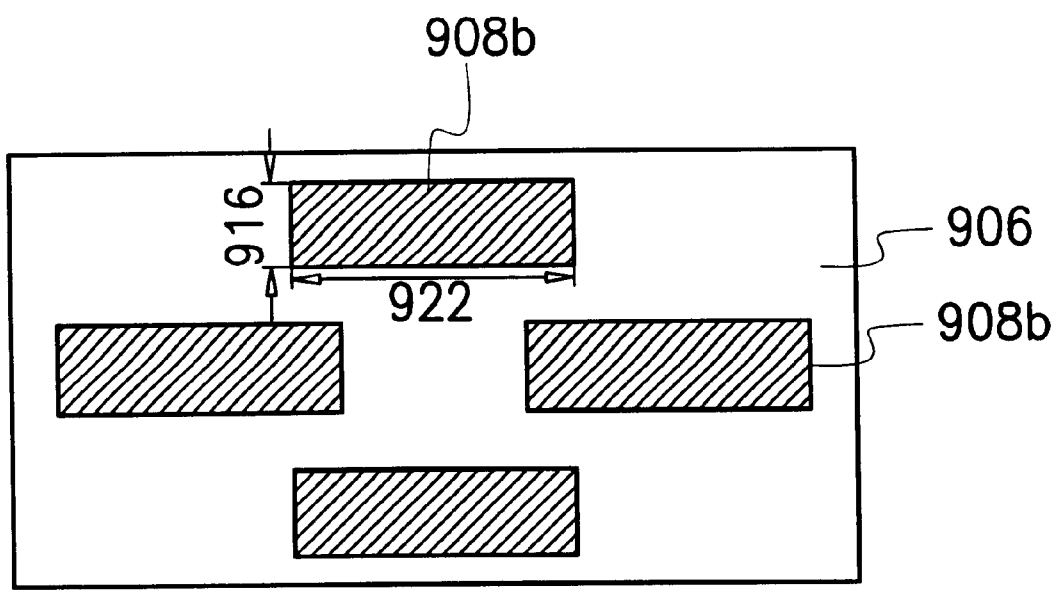
FIG. 14B is a top view of FIGS. 12E and 13E.

As shown in FIG. 14B, after the photolithographic and etching operations and the removal of the photoresist layer 918, the remaining hard mask layer 908b above the hard mask layer 906 has the shape of a rectangular island. The rectangular island 908b and the mask layer 904 of the desired rectangular island 940 (in other words, the area 938 enclosed by dashed lines) overlap. The length 916 on one side of the hard mask layer 908b is identical to the length 944 on one side of the desired rectangular island 940. The length 922 on the other side of the hard mask layer 908b is also identical to the length 942 on the other side of the desired rectangular island 940.

Figure 12F:
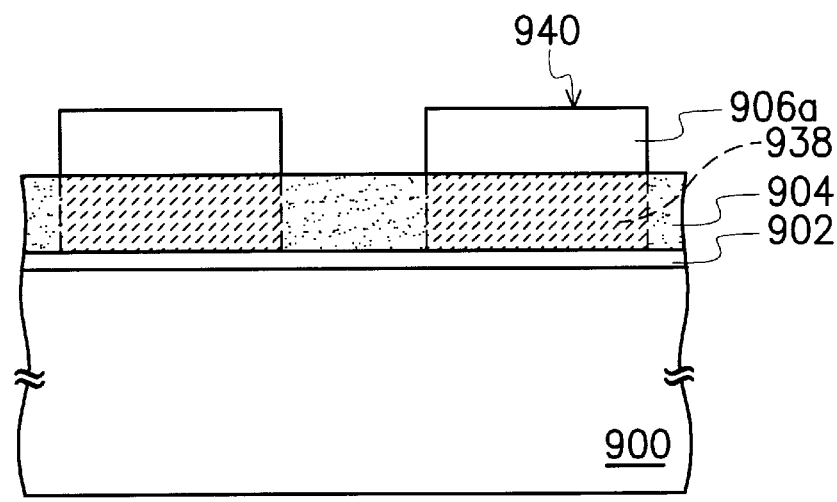
Figure 13F:
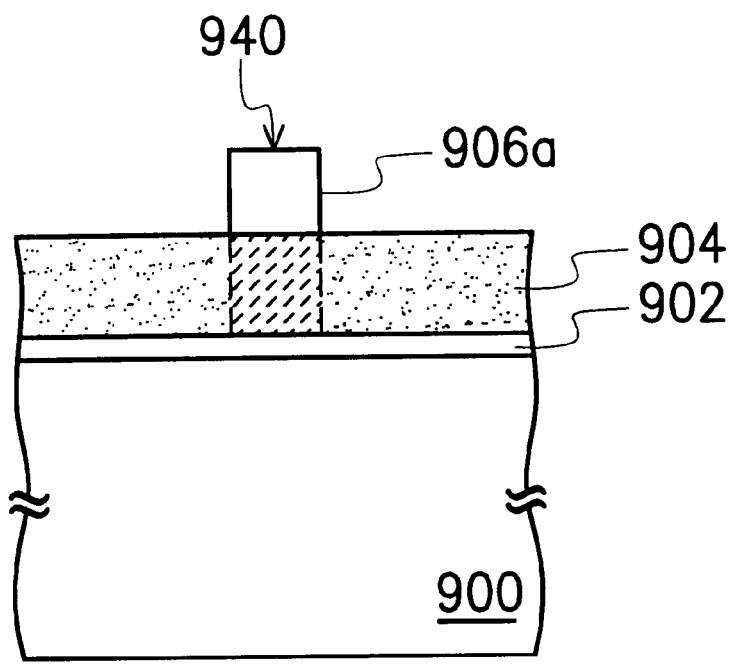

As shown in FIGS. 12F and 13F, while using the hard mask layer 908b as an etching mask, a portion of the hard mask layer 906 is removed and the desired rectangular island pattern 940 in the hard mask layer 908b is transferred to the remaining hard mask layer 906a. Hence, the hard mask layer 906a containing the rectangular island pattern 940 is formed on top of the mask layer 904 where the desired rectangular island pattern 940 should be formed. In other words, the hard mask layer 906a now covers the area 938.

Figure 12G:
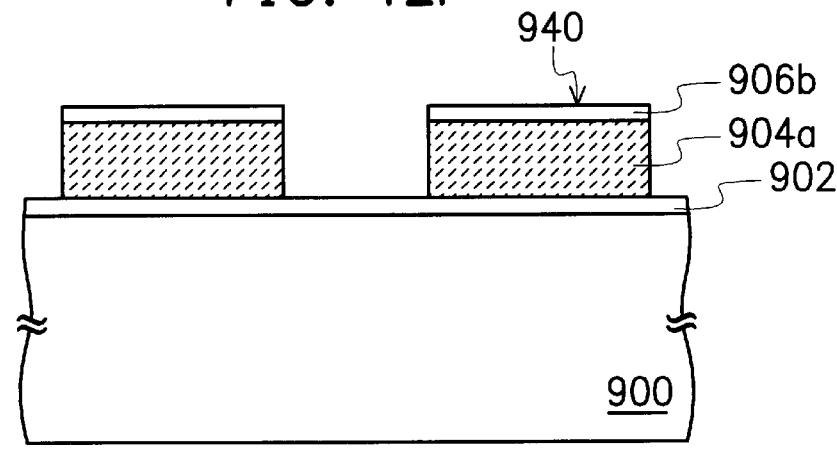
Figure 13G:
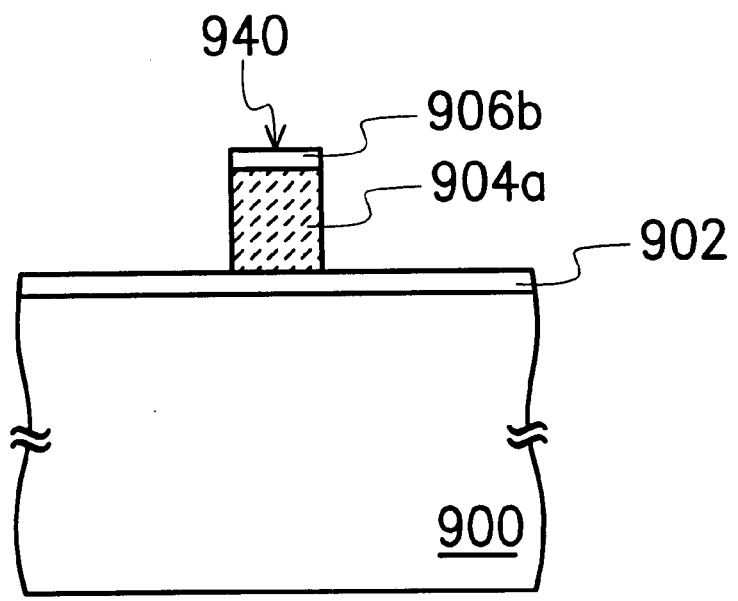

As shown in FIGS. 12G and 13G, an etching operation such as an anisotropic etching operation is carried out to remove a portion of the mask layer 904 while using the hard mask layer 906a as an etching mask. In other words, the mask layer 904 outside the region 938 is removed so that the remaining mask layer 904a has the rectangular island pattern 940. For example, if the hard mask layer 906a is a silicon oxide layer while the mask layer 904 is a silicon nitride layer, an etchant having an etching selectivity ratio of 3:1 between silicon nitride and silicon oxide can be used in the etching operation. Since relative thickness between the hard mask 906a and the mask layer 904a is closely related to the etching conditions, thickness of the layers and etching conditions must be carefully selected. After patterning the mask layer 904 into the mask layer 904a with rectangular islands 940, the hard mask layer 906b is removed.

Figure 12H:
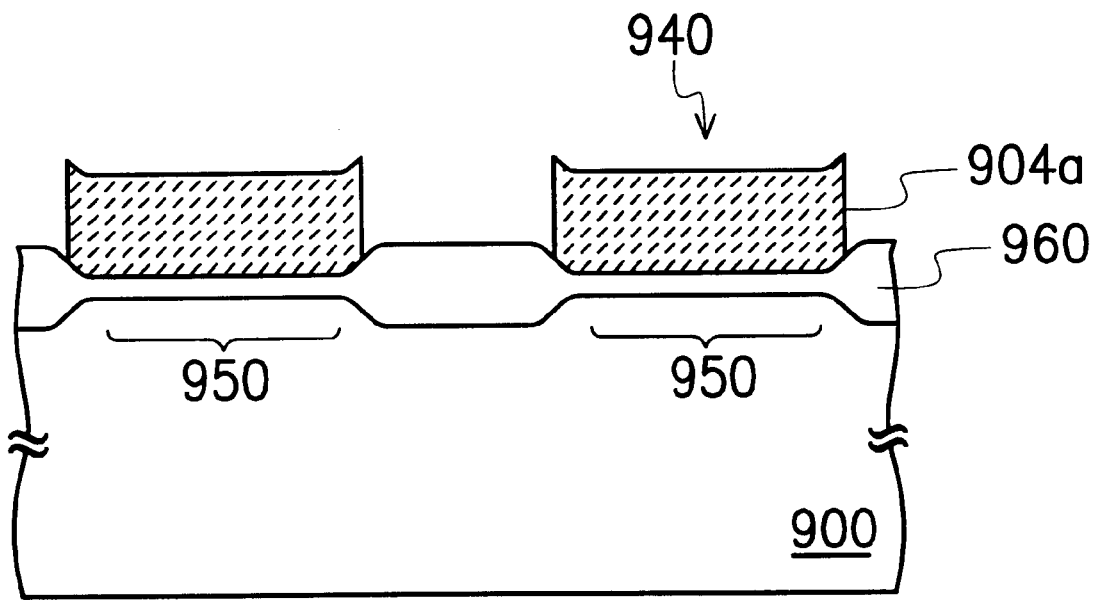
Figure 12I:
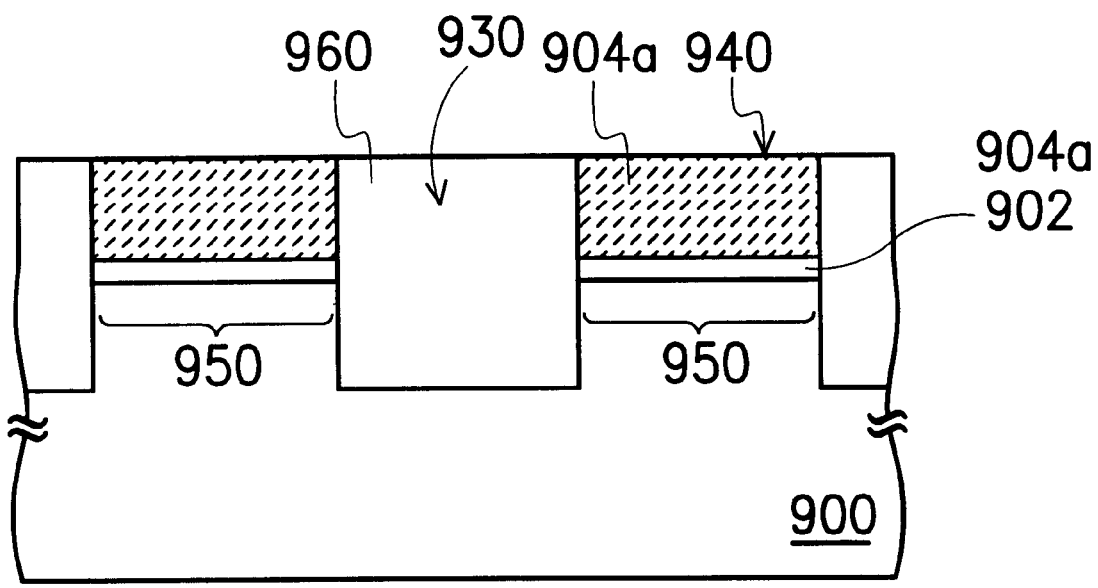
Figure 13H:
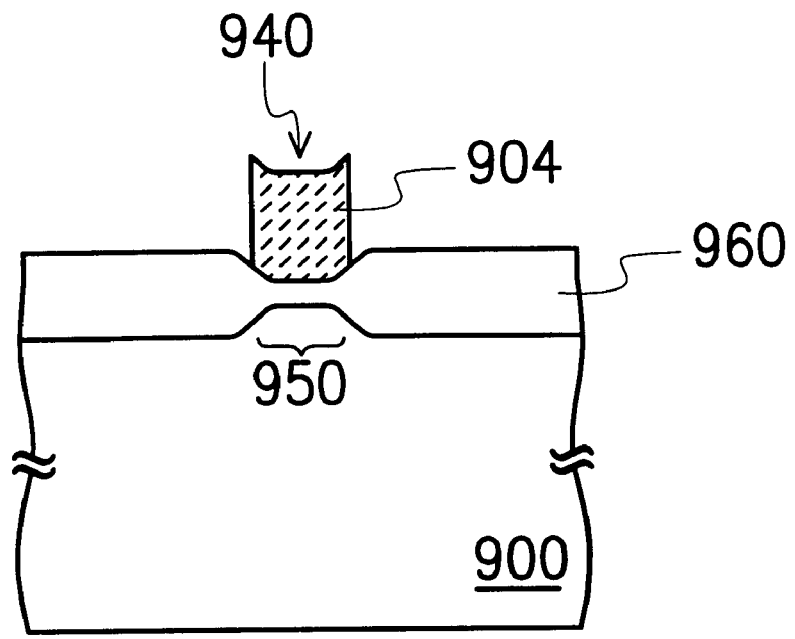
Figure 13I:
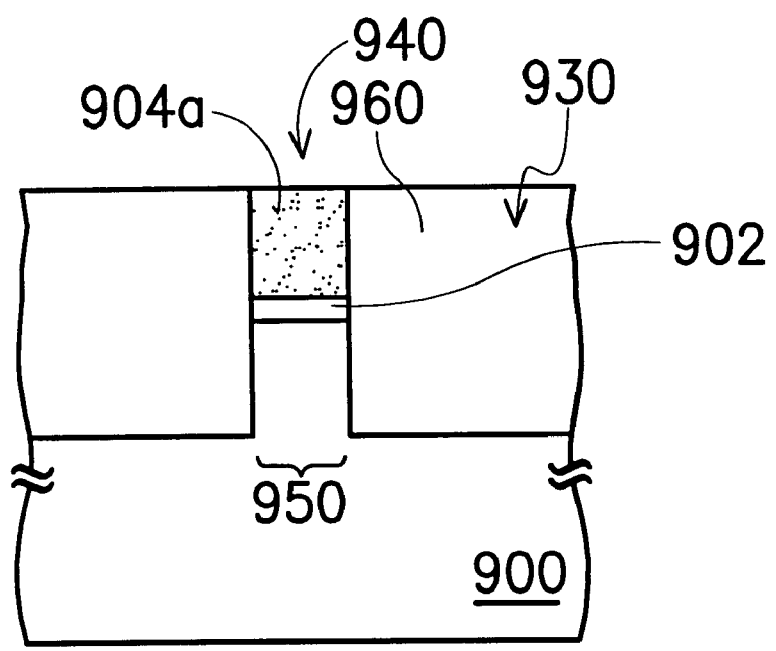

Using the mask layer 904a as a mask, isolation structures 960 can be formed in the substrate 900 to mark out rectangular active regions 950 by a local oxidation method or a shallow trench isolation process. In FIGS. 12H and 13H, a thermal oxidation is carried out to form isolation structures 960 around the rectangular active region 950 while using the mask layer 904a as an oxidation mask. In FIGS. 12I and 13I, the shallow trench isolation process is carried out by etching away the pad oxide layer 902 and substrate 900 to form a trench 930 while using the mask layer 904a as an etching mask. In the subsequent step, insulation material is deposited into the trench 930 so that the rectangular active region 950 is surrounded by the isolation region 960. Finally, the mask layer 902b and the pad oxide layer 902 are removed to expose the rectangular active region 950.

Most problems of photolithography occur in the corner regions. In the first embodiment of this invention, the length of the linear opening 210 in the first photoresist layer 208 is greater than the length 242 on one side of the desired rectangular opening 240. Similarly, the length of the linear opening 218 in the second photoresist layer 216 is also greater than the length 244 on the other side of the desired rectangular opening 240. Consequently, even though corner rounding occurs during a photolithographic operation, the desired profile can still be obtained because rounding mainly occurs at the far ends of the linear patterns (in regions not for producing the rectangular opening 240) of the first photoresist layer 208 and the second photoresist layer 216. After eliminating the corner rounding regions, side lengths of the remaining linear openings 210 and 218 are still greater than the side lengths of the desired rectangular opening pattern 240. Thus, the method of this invention is capable of forming perfect rectangular opening patterns.

In the second embodiment of this invention, the length 914 of the linear island 912 in the first photoresist layer 910 is greater than the length 942 on one side of the desired rectangular island 940. Similarly, the length 924 of the rectangular island 920 in the second photoresist layer 918 is greater than the length 944 on the other side of the desired rectangular island 940. Consequently, even though corner rounding occurs during a photolithographic operation, the desired island profile can still be obtained because rounding mainly occurs at the far ends of the linear island patterns (in regions not for producing the rectangular opening 240) of the first photoresist layer 208 and the second photoresist layer 216. After eliminating the corner rounding regions, side lengths of the remaining linear islands 912 and 920 are still greater than the side lengths of the desired rectangular island pattern 940. Thus, the method of this invention is capable of forming perfect rectangular island patterns.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A patterning method capable of forming a desired pattern on a material layer above a substrate, comprising the steps of:

forming a hard mask layer over the material layer;

forming a first photoresist layer over the hard mask layer, wherein the first photoresist layer contains a first pattern;

performing a first etching operation while using the first photoresist layer as an etching mask to remove a portion of the hard mask layer so that the first pattern in the first photoresist layer is transferred to the hard mask layer;

removing the first photoresist layer;

forming a second photoresist layer over the substrate, wherein the second photoresist layer contains a second pattern, and the second pattern and the first pattern overlap to form an overlapping region;

performing a second etching operation while using the second photoresist layer and the hard mask layer as an etching mask to remove a portion of the material layer so that the desired pattern is transferred to the material layer; and removing the second photoresist layer.

2. The method of claim 1, wherein the hard mask layer is patterned to form first long-shaped strips over the material layer and the second photoresist layer is patterned later to form second long-shaped strips over the material layer, wherein the first long-shaped strips are arranged in such a way perpendicular to the second long-shaped strips and the desired pattern is obtained.

3. The method of claim 2, wherein the hard mask layer and the material layer have different etching rates.

4. The method of claim 1, wherein the hard mask layer and the material layer have different etching rates.

5. A patterning method capable of forming a desired pattern on a material layer above a substrate, comprising the steps of:

forming a hard mask layer over the material layer;

forming a first photoresist layer over the hard mask layer, wherein the first photoresist layer contains a first pattern;

performing a first etching operation while using the first photoresist layer as an etching mask to remove a portion of the hard mask layer so that the first pattern is transferred to the hard mask layer;

removing the first photoresist layer;

forming a second photoresist layer over the substrate, wherein the second photoresist layer contains a second pattern and the second pattern and the first pattern overlap to form an overlapping region;

performing a second etching operation while using the second photoresist layer and the hard mask layer as an etching mask to remove a portion of the hard mask layer so that the desired pattern is transferred to the hard mask layer;

removing the second photoresist layer; and performing a third etching operation while using the hard mask layer as an etching mask to remove a portion of the material layer so that the desired pattern is transferred to the material layer.

6. The patterning method of claim 5, wherein:

the desired pattern includes a first rectangular island having a pair of first sides and a pair of second sides;

the first pattern includes a linear island, wherein the linear island is parallel to the first side of the first rectangular island and the linear island is positioned above the first rectangular island, the linear island has a width substantially equals to the second side of the first rectangular island and a length greater than the length of the first side of the first rectangular island; and the second pattern includes a second rectangular island above the first rectangular island, wherein the second rectangular island has a pair of first sides and a pair of second sides such that a width of the first side substantially equals to the width of the first side of the first rectangular island and a length of the second side is greater than the length of the second side of the first rectangular island.

7. The method of claim 6, wherein the hard mask layer and the material layer have different etching rates.

8. The method of claim 5, wherein the hard mask layer and the material layer have different etching rates.

9. A method of forming an isolation structure, comprising the steps of:

providing a substrate;

forming a pad oxide layer over the substrate;

forming a material layer over the pad oxide layer;

forming a hard mask layer over the material layer;

forming a first photoresist layer over the hard mask layer, wherein the first photoresist layer contains a first linear opening;

performing a first etching operation while using the first photoresist layer as an etching mask to remove a portion of the hard mask layer so that the first linear opening pattern is transferred to the hard mask layer;

removing the first photoresist layer;

forming a second photoresist layer over the substrate, wherein the second photoresist layer contains a second linear opening that exposes a portion of the material layer and the hard mask layer, the second linear opening is perpendicular to the first linear opening, their overlapping areas form a rectangular region, and the rectangular region exposes a portion of the material layer;

performing a second etching operation while using the second photoresist layer and the hard mask layer as an etching mask to remove the material layer inside the rectangular region so that a rectangular opening is formed in the material layer;

removing the second photoresist layer to expose the material layer; and forming a rectangular isolation structure in the substrate while using the material layer as a mask.

10. The method of claim 9, wherein the hard mask layer and the material layer have different etching rates.

11. The method of claim 10, wherein the hard mask layer includes silicon oxide and the material layer includes silicon nitride.

12. The method of claim 9, wherein the step of forming the rectangular isolation structure includes forming a shallow trench isolation structure.

13. A method for forming a rectangular active region, comprising the steps of:

providing a substrate;

forming pad oxide layer over the substrate;

forming a material layer over the pad oxide layer;

forming a first hard mask layer over the material layer;

forming a second hard mask layer over the first hard mask layer;

forming a first photoresist layer over the second hard mask layer, wherein the first photoresist layer contains a linear island;

performing a first etching operation while using the first photoresist layer as an etching mask to remove a portion of the second hard mask layer so that the linear island pattern is transferred to the second hard mask layer;

removing the first photoresist layer;

forming a second photoresist layer over the substrate, wherein the second photoresist layer contains a rectangular island above the linear island of the second hard mask such that one side of the rectangular island is greater than a width of the linear island and the rectangular island and the linear island overlap to form a rectangular region;

performing a second etching operation while using the second photoresist layer and the second hard mask layer as an etching mask to remove the second hard mask layer outside the overlapping rectangular region so that a remaining second hard mask layer forms a rectangular island;

removing the second photoresist layer;

removing a portion of the first hard mask layer while using the second hard mask layer as an etching mask to form a rectangular island pattern in the first hard mask layer;

removing a portion of the material layer while using the first hard mask layer as an etching mask to form a rectangular island pattern in the material layer;

forming an isolation structure in the substrate outside the material layer; and removing the material layer and the pad oxide layer to expose the rectangular active region.

14. The method of claim 13, wherein the second hard mask layer and the first hard mask layer have different etching rates, and similarly, the first hard mask layer and the material layer have different etching rates.

15. The method of claim 14, wherein the second hard mask layer includes polysilicon, the first hard mask layer includes silicon oxide and the material layer includes silicon nitride.

16. The method of claim 13, wherein the material layer, the pad oxide layer and the substrate all have different etching rates.

17. The method of claim 13, wherein the step of forming the isolation structure includes forming a shallow trench isolation structure.

* * * * *